(12) United States Patent
Tsukimoto

(10) Patent No.: US 8,059,879 B2
(45) Date of Patent: Nov. 15, 2011

(54) BRAIN FUNCTION ANALYSIS APPARATUS AND METHOD

(75) Inventor: Hiroshi Tsukimoto, Tokyo (JP)

(73) Assignee: Tokyo Denki University, Tokyo (JP)

( * ) Notice: Subject to any disclaimer, the term of this patent is extended or adjusted under 35 U.S.C. 154(b) by 24 days.

(21) Appl. No.: 12/089,855

(22) PCT Filed: Oct. 6, 2006

(86) PCT No.: PCT/JP2006/320078
§ 371 (c)(1),
(2), (4) Date: Aug. 8, 2008

(87) PCT Pub. No.: WO2007/043462
PCT Pub. Date: Apr. 19, 2007

(65) Prior Publication Data
US 2009/0279762 A1    Nov. 12, 2009

(30) Foreign Application Priority Data

Oct. 12, 2005    (JP) ................................. 2005-298236

(51) Int. Cl.
*G06K 9/00* (2006.01)
(52) U.S. Cl. .......................................................... 382/131
(58) Field of Classification Search .................. 382/128, 382/131; 324/307; 345/419; 600/407–410
See application file for complete search history.

(56) References Cited

U.S. PATENT DOCUMENTS
2006/0084858 A1 * 4/2006 Marks ........................... 600/407
2007/0043401 A1 * 2/2007 John .............................. 607/45

FOREIGN PATENT DOCUMENTS
JP    09-047438    2/1997
JP    2004-081657    3/2004

OTHER PUBLICATIONS

Teo et al. ("Creating connected representation of cortical gray matter for functional MRI visualization," IEEE T. on Medical Imaging, vol. 16, No. 6, Dec. 1997, pp. 852-863).*
Eberich et al. ("Neurodevelopment assessment of newborns with combined fMRI and DTI," Proceedings of SPIE. vol. 5369, 2004, pp. 250-258).*
Lin et al. ("Non-invasive fiber tracking on diffusion tensor MRI using high-temperature superconducting tape RF coil," Proc. 2005 IEEE Engineering in Medicine and Biology 27th Annual Conference, Sep. 2005, pp. 2329-2331).*
Lanius et al. ("The nature of traumatic memories—A 4-T fMRI functional connectivity analysis," American Journal of Psychology, 161:1, Jan. 2004, pp. 1-9).*
Supplementary European Search Report—(EP 06811405) Dated Oct. 19, 2009.

(Continued)

*Primary Examiner* — Yubin Hung
(74) *Attorney, Agent, or Firm* — Foley & Lardner LLP

(57) ABSTRACT

There is provided a method including, acquiring brain function data and diffusion tensor data, calculating a connection degree between voxels adjacent to each other based on the diffusion tensor data, constituting a data evaluation value based on the brain function data and the connection degree between the adjacent voxels, subjecting the data evaluation value to nonparametric regression analysis, and forming and displaying images based on results of the analysis.

24 Claims, 23 Drawing Sheets

OTHER PUBLICATIONS

Ramnani, et al., "New Approaches for Exploring Anatomical and Functional Connectivity in the Human Brain", *Biological Psychiatry*, Elsevier Science, New York, NY, US, 2004, vol. 56, pp. 613-619.

Werring, et al., "A Direct Demonstration of Both Structure and Function in the Visual System: Combining Diffusion Tensor Imaging with Functional Magnetic Resonance Imaging", *Neuroimage*, Academic Press, Orlando, FL, US, 1999, vol. 9, pp. 352-361.

Jang Sung Ho, et al., "Cortical Reorganization Associated Lower Extremity Motor Recovery as Evidenced by Functional MRI and Diffussion Tensor Tractography in a Stroke Patient", *Restorative Neurology and Neuroscience*, IOS Press, NL, 2005, vol. 23, pp. 325-329.

Kim, et al., "Fiber Tractography Visualizing Altered White Matter Connection in Periventricular Leukomalacia: PET Correlation Study", *International Society for Magnetic Resonance in Medicine. Scientific Meeting and Exhibition. Proceedings*, International Society for Magnetic Resonance in Medicine, US, 2004, vol. 11, p. 1265.

Lucy Lee, et al., "Workshop Report; The Functional Brain Connectivity Workshop: report and commentary; Functional Brain Connectivity Workshop", *Network: Computation in Neural Systems*, IOP Publishing, Bristol, GB, 2003, vol. 14, pp. R1-R15.

Office Action issued in European Application No. 06811405.7-2209 dated Jul. 30, 2010.

Toosy, A. T. et al., "Characterizing function—structure relationships in the human visual system with functional MRI and diffusion tensor imaging," Neuroimage, vol. 21, No. 4, Apr. 1, 2004, pp. 1452-1463.

Frackowiak, Richard S.J. et al., Experimental Design and Statistical Parametric Mapping, *Human Brain Function*, 2d Ed. Ch. 31:pp. 599-632 (2004).

Guye, Maxime et al., Combined Functional MRI and Tractography to Demonstrate the Connectivity of the Human Primary Motor Cortex in vivo, *NeuroImage*, 19:1349-1360 (2003).

International Search Report for PCT/JP2006/320078 dated Oct. 31, 2006.

Japanese Patent Office's Notification of Reasons for Refusal (for Japanese Patent Application No. 2007-539917), dated Sep. 16, 2008.

Talos, Ion-Florin et al., Diffusion Tensor and Functional MRI Fusion with Anatomical MRI for Image-Guided Neurosurgery, *MICCAI 2003, LNCS* 2878:407-415 (2003).

Tsukimoto, Hiroshi et al., Nonparametric Regression Analysis of Functional Brain Images, *Systems and Computers in Japan*, 35(1):67-77 (2004).

Tsukimoto, Hiroshi et al., Rule Discovery from fMRI Brain Images by Logical Regression Analysis, S. Arikawa and A. Shinohara (Eds.): *Progress in Discovery Science*, LNAI:2281:232-245 (2001).

Tsukimoto, Hiroshi et al., The Analysis of fMRI Images by Logical Regression Analysis, (English abstract provided) *IEICE Technical Report*, 104(88):59-64 (2004).

\* cited by examiner

FIG. 4

| $i(t_i)$ \ $j$(for $S_k$) | 1 | 2 | ... | m | ... | 4096 | CLASS |
|---|---|---|---|---|---|---|---|
| 1 | $\rho_k(1,1)$ / $D_k(1)$ | $\rho_k(2,1)$ / $D_k(2)$ | | | | $\rho_k(4096,1)$ / $D_k(4096)$ | ON ($\equiv 1$) |
| ... | | | | | | | ... |
| i | | | ... | $\rho_k(j,i)$ / $D_k(j)$ | ... | | |
| ... | | | | | | | ... |
| 18 | $\rho_k(1,18)$ / $D_k(1)$ | $\rho_k(2,18)$ / $D_k(2)$ | | | | $\rho_k(4096,18)$ / $D_k(4096)$ | OFF ($\equiv 0$) |

(EXAMPLE) $\rho_k(j,i) = 5000$, $D_k(j) = \begin{pmatrix} 1.0 & 1.2 & 1.1 \\ 1.2 & 0.8 & 0.9 \\ 1.1 & 0.9 & 0.7 \end{pmatrix}$

| i \ j (for $S_k$) | 1 | 2 | ... | 4096 | CLASS |
|---|---|---|---|---|---|
| 1 | $\rho_k(1,1)=7900$ | $\rho_k(2,1)=7700$ | ... | $\rho_k(4096,1)=3900$ | ON ($\equiv 1$) |
| 2 | $\rho_k(1,2)=5100$ | $\rho_k(2,2)=3800$ | | $\rho_k(4096,2)=4500$ | ON ($\equiv 1$) |
| ... | | | ... | | ... |
| 18 | $\rho_k(1,18)=3700$ | $\rho_k(2,18)=3500$ | ... | $\rho_k(4096,18)=4200$ | OFF ($\equiv 0$) |

(B)

| i \ j (for $S_k$) | 1 | 2 | ... | 4096 | CLASS |
|---|---|---|---|---|---|
| 1 | $\rho_k(1,1)=A$ | $\rho_k(2,1)=A$ | ... | $\rho_k(4096,1)=I$ | ON ($\equiv 1$) |
| 2 | $\rho_k(1,2)=A$ | $\rho_k(2,2)=I$ | | $\rho_k(4096,2)=A$ | ON ($\equiv 1$) |
| ... | | | ... | | ... |
| 18 | $\rho_k(1,18)=I$ | $\rho_k(2,18)=I$ | ... | $\rho_k(4096,18)=A$ | OFF ($\equiv 0$) |

(A) (B)

WERNICKE AREA

BROCA'S AREA (C)

ARCUATE FASCICULUS (D)

ARCUATE FASCICULUS

BRAIN FUNCTION ANALYSIS APPARATUS AND METHOD

TECHNICAL FIELD

The present invention relates to a brain function analysis apparatus, a brain function analysis method and a brain function analysis program for analyzing brain functions utilizing various kinds of data obtained by measurement techniques such as fMRI (functional Magnetic Resonance Imaging) or PET (Positron Emission Tomography).

BACKGROUND ART

While typical non-invasive methods for measuring brain functions include fMRI, PET, MEG (magnetoencephalography) at present, the fMRI is considered to have the highest spatial resolution of data among them and is widely used.

The fMRI is a method for imaging various kinds of physical quantity allowing to locate activated brain regions as a measuring quantity, and is an effective technique for measuring brain functions (refer to Non-patent Documents 1 and 2). While reflecting the proton density, longitudinal relaxation time $T_1$, and transverse relaxation time $T_2$ of tissues in a living body as same as the principle of an anatomical MRI which images a brain structure, fMRI particularly has a feature to detect an increase in blood flow volume in an activated brain region. It is known that the blood flow volume will locally increase in the activated brain region and hemoglobin in blood differs in its magnetic properties between a state that oxygen is bound thereto (oxygenated hemoglobin) and a state that it is released therefrom (deoxygenated hemoglobin). It is considered that fMRI signals (BOLD signals) in an active region will increase since the amount of deoxygenated hemoglobin which disturbs a magnetic field is decreased in the increased arterial blood. Hence, the use of fMRI can locate regions in the brain related to the task (active region), by following a change in BOLD signal when a subject is performing a certain task.

Typical techniques to analyze the time series data of BOLD signals measured by fMRI includes SPM (Statistical Parametric Mapping) based on a general linear model (refer to Non-patent Document 1), a data analysis based on a principal component analysis and an independent component analysis (refer to Non-patent Document 3). These techniques have features in which results in which the time series data of the BOLD signals is individually subjected to statistical processing for every three-dimensional pixel (Voxel) is output as an image to locate activated brain regions.

In the above analysis techniques, however, there exists an issue that the network structures of neurons are not taken into consideration upon analyzing data. Many neurons constitute a complicated network via synapses in a brain, and it is considered that the brain realizes a higher brain function as a whole by mutual cooperation of each region thereof via such a neural network according to recent knowledge of brain science. For example, when the subject performs a certain task, it is observed a phenomenon that a plurality of regions are activated in the brain. Then, the analysis of this phenomenon using the above analysis techniques enables to locate each active region, but it is difficult to locate a connection between the active regions.

This has an underlying cause as follows. Since BOLD signals measured by fMRI are based on blood flow volume as described above, the activity of a gray matter (cell body of the neuron) having a relatively high blood flow volume in the brain is captured, but the activity of a white matter (axon of the neuron, or nerve fiber) having relatively low blood flow volume is hardly captured by fMRI.

Meanwhile, as a method for capturing a running direction of a nerve fiber group, which is the basis of the neural network structures, it has recently drawn attention a DTI (Diffusion Tensor Imaging) method in which the degree of proton diffusion in a body tissue is measured as a new observation quantity of MRI (refer to Non-patent Document 4). When a normal anatomical MRI is utilized, a nerve fiber becomes a high signal in a $T_1$ weighted image and a low signal in $T_2$ weighted image. The reason that the nerve fiber is converted into the high signal in the $T_1$ weighted image is in presence of myelin. The myelin is composed of a lipid with a double-layer structure and a huge protein and takes a form to arrange along the running direction of the nerve fiber. Hence, there occurs anisotropy that the diffusion constant of protons is large in the running direction of the nerve fiber and is small in a direction perpendicular to it. DTI is the technique of measuring the anisotropy of diffusion by applying MPG (Motion Probing Gradient): $\{\vec{G}\} = (G_x, G_y, G_z)^T$ in order to emphasize the diffusion of protons. It is the technique, for example, to measure the intensity $S'(l, m, k, i)$ of a BOLD signal obtained by ST (Stejskal-Tanner) pulse sequence in which STG (Stejskal-Tanner Gradient) pulses for diffusion detection are added to before and after SE (Spin Echo) pulses. Here "l", "m" and "k" are positive discrete variables representing the position of a voxel and represent an X coordinate, Y coordinate and Z coordinate of the voxel, respectively. In addition, "i" is a positive discrete variable representing a measuring time. The intensity $S'(l, m, k, i)$ of the BOLD signal can be written as $$S'(l,m,k,i) = \rho'(l,m,k,i)\exp(-b\vec{G}^T \mathbb{D}(l,m,k)\vec{G}). \quad (1)$$

When a diffusion weighted image is generated, the diffusion tensor:

$$D(l, m, k) = \begin{pmatrix} D_{ll}(l, m, k) & D_{lm}(l, m, k) & D_{lk}(l, m, k) \\ D_{ml}(l, m, k) & D_{mm}(l, m, k) & D_{mk}(l, m, k) \\ D_{kl}(l, m, k) & D_{km}(l, m, k) & D_{kk}(l, m, k) \end{pmatrix} \quad (2)$$

in Equation (1) will be an object of the data analysis. Here $\rho'(l, m, k, i)$ represents the intensity of a BOLD signal with no application of MPG, which is an object of data analysis in the normal brain function analysis, and "b" is a parameter representing the strength of MPG. Note that $\rho'(l, m, k, i)$ is represented by $$\rho'(l, m, k, i) \propto f(v) \cdot \xi'(l, m, k, i) \cdot \left(1 - \exp\left(-\frac{T_R}{T_1}\right)\right) \cdot \exp\left(-\frac{T_E}{T_2}\right) \quad (3)$$

where $f(v)$ represents a flow velocity, $T_R$ a repetition time, $T_E$ an echo time; and $\xi'(l, m, k, i)$ a proton density.

There has been currently used a brain function analysis method in which Regions of Interest (ROI) in a brain are connected by a diffusion tensor data $D(l, m, k)$ after analyzing the time series data of BOLD signals $\rho'(l, m, k, i)$ obtained by fMRI measurement (refer to Non-patent Document 5).

Non-patent Document 1: "Human Brain Function: 2nd-Ed.", Richard S. J. Frackowiak, et al, ELSEVIER ACADEMIC PRESS, 2004

Non-Patent Document 2: "Image of Mind", M. I. Posner and M. E. Raichle, W H Freeman & Co, 1997

Non-patent Document 3: "Independent Component Analysis: Theory and Applications", T. W. Lee, Kluwer Acadmic, 1988

Non-patent Document 4: "Korede wakaru diffusion MRI" S. Aoki, O. Abe, Syuujyun sha, 2002

Non-patent Document 5: "Combined functional MRI and tractography to demonstrate the connectivity of the human primary motor cortex in vivo", Guye M, et al., Neuroimage, Vol. 19, pp. 1349-1360, 2003

DISCLOSURE OF THE INVENTION

In the above brain function analysis method, however, the diffusion tensor data D(l, m, k) is not used for the analysis of the time series data of the BOLD signals ρ'(l, m, k, i) itself, thus there are strong doubts about its effectiveness.

The present invention is made in view of the above problems, and it aims at providing a brain function analysis method and a brain function analysis program capable of analyzing brain function data also in consideration of a connection structure between activated brain regions based on the brain function data measured by a non-invasive measuring method, such as fMRI, PET, or the like, and diffusion tensor data capable of specifying a running direction of a nerve fiber group.

One aspect of the present invention is to provide a brain function analysis method, including: a first step of acquiring, on a voxel-by-voxel basis, brain function data capable of locating activated brain regions, and diffusion tensor data capable of specifying a degree of diffusion of protons within the brain; a second step of constituting an evaluation value of a connection degree between voxels adjacent to each other based on the diffusion tensor data; and a third step of analyzing the brain function data based on the evaluation value of the connection degree between the adjacent voxels.

Other aspect of the present invention is to provide a brain function analysis program causing a computer to function as: brain function data acquisition means for acquiring, on a voxel-by-voxel basis, brain function data capable of locating activated brain regions; diffusion tensor data acquisition means for acquiring, on a voxel-by-voxel basis, diffusion tensor data capable of specifying a degree of diffusion of protons within the brain; data evaluation value constitution means for constituting an evaluation value of the connection degree between voxels adjacent to each other based on the diffusion tensor data; and data analysis means for analyzing the brain function data based on the evaluation value of the connection degree between the adjacent voxels. Other aspect of the present invention is to provide a brain function analysis apparatus comprising: brain function data acquisition means for acquiring, on a voxel-by-voxel basis, brain function data capable of locating activated brain regions; diffusion tensor data acquisition means for acquiring, on a voxel-by-voxel basis, diffusion tensor data capable of specifying a degree of diffusion of protons within the brain; data evaluation value constitution means for constituting an evaluation value of the connection degree between voxels adjacent to each other based on the diffusion tensor data; and data analysis means for analyzing the brain function data based on the evaluation value of the connection degree between the adjacent voxels.

BRIEF DESCRIPTION OF THE DRAWINGS

FIG. 3 is a view illustrating a typical fMRI image (two-dimensional slice image), wherein FIG. 3A shows a head of a subject on a bed, and FIG. 3B shows a voxel composing a two-dimensional cross section (two-dimensional slice image) of the head;

FIG. 4 is a table illustrating time series data and diffusion tensor data of brain function information on the voxels composing the two-dimensional slice image;

FIG. 5 is a table showing one example of the time series data of the brain function information shown in FIG. 4, wherein FIG. 5A shows actual measurement values, and FIG. 5B shows values obtained by binarizing the actual measurement values based on a threshold;

FIG. 6 is a view of a stereoscopic configuration of the time series data and the diffusion tensor data of the brain function information shown in FIG. 4, wherein FIG. 6A shows the head of the subject on the bed, and FIG. 6B shows a procedure for generating a k-th two-dimensional slice image $S_k$ from the time series data and the diffusion tensor data of the brain function information shown in FIG. 4;

FIG. 7 is a view illustrating a head image which is three-dimensionally configured from the two-dimensional slice images $S_k$ shown in FIG. 6, wherein FIG. 7A shows the head of the subject on the bed, and FIG. 7B shows a head image which is three-dimensionally configured by collecting the two-dimensional slice images $S_k$;

FIG. 9 is a view showing one example of a data preprocessing technique in accordance with the present invention, wherein FIG. 9A shows data preprocessing in an area where both of two voxels adjacent to a certain voxel are regarded as gray matters, FIG. 9B shows data preprocessing in an area where only one of the two voxels is regarded as the gray matter, and FIG. 9C shows data preprocessing in an area where neither of two voxels is regarded as the gray matter;

FIG. 17 is a view illustrating a clustering technique performed by clustering means 300 shown in FIG. 15, wherein FIG. 17A shows values of connection degree vectors before performing clustering processing, and FIG. 17B shows values of connection vectors after performing the clustering processing;

FIG. 24C shows analysis results using a brain function analysis technique in which SPM and tractography are combined, and FIG. 24D shows analysis results using a brain function analysis method in accordance with the first embodiment of the present invention.

BEST MODE FOR CARRYING OUT THE INVENTION

The present invention is characterized by acquiring brain function data and diffusion tensor data on a voxel-by-voxel basis from a non-invasive measuring apparatus such as MRI or the like in order to locate activated brain regions, constituting an evaluation value of a connection degree between voxels adjacent to each other from the diffusion tensor data, and analyzing the brain function data using the evaluation value of the connection degree between the adjacent voxels. The evaluation value of the connection degree between the adjacent voxels of the above brain function data is variously considered depending on data analysis techniques, and how to use the evaluation value of the connection degree between voxels adjacent to each other is also variously considered depending on data analysis techniques.

There will be described embodiments of the present invention in detail with reference to the drawings.

First Embodiment

Figure 1:
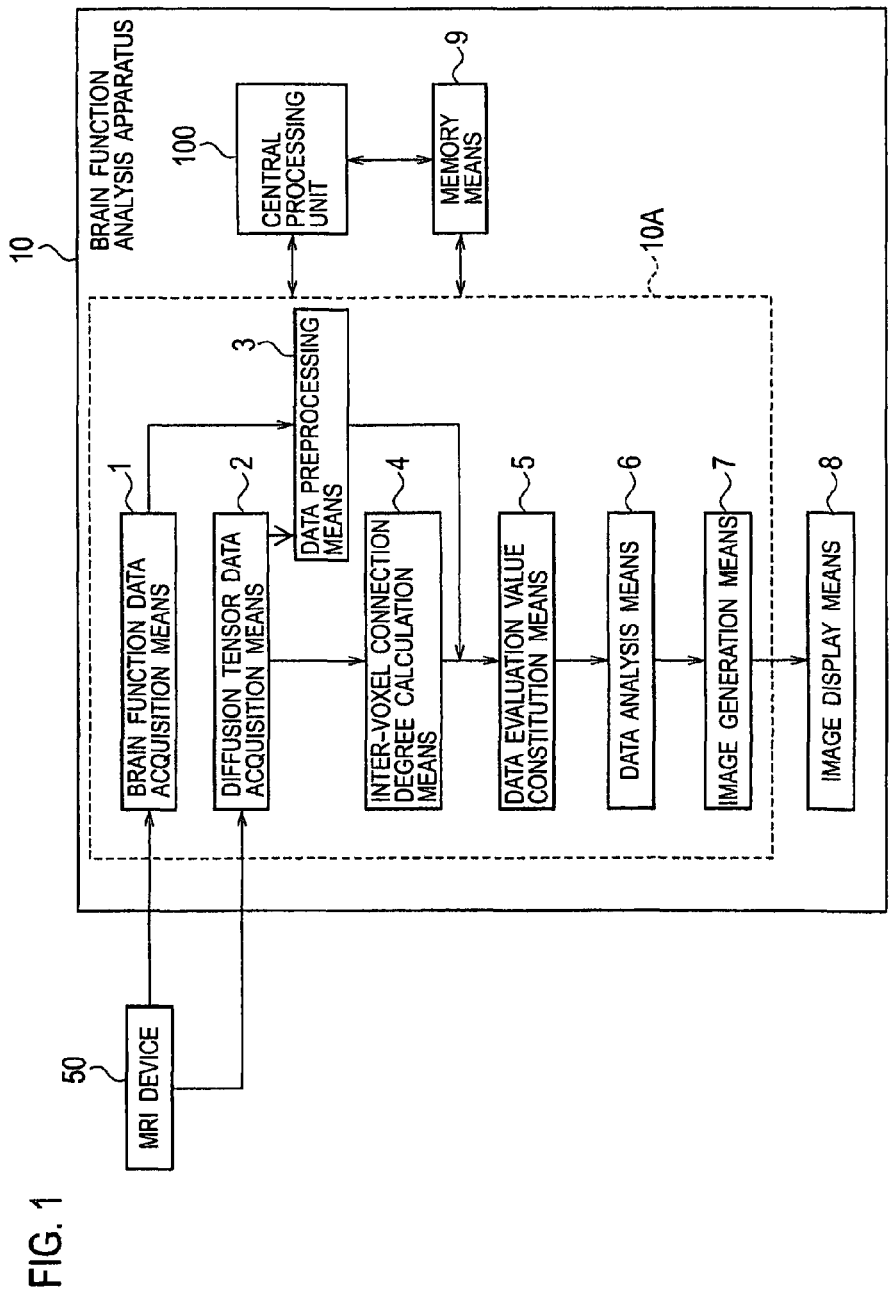
FIG. 1 is a block diagram showing a schematic configuration of a brain function analysis apparatus in accordance with a first embodiment of the present invention.

FIG. 1 is a block diagram showing a schematic configuration of a brain function analysis apparatus in accordance with a first embodiment of the present invention. A brain function analysis apparatus 10 of the first embodiment is provided with brain function data acquisition means 1 for acquiring original time series data $\rho'(l, m, k, i)$ (for example, Equation (3)) of brain function information which is measured by an MRI device 50; diffusion tensor data acquisition means 2 for acquiring diffusion tensor data $D(l, m, k)$ (for example, Equation (2)) which is measured also by the MRI device 50; data preprocessing means 3 for pre-processing the original time series data $\rho'(l, m, k, i)$ of the brain function information which is acquired by the brain function data acquisition means 1; inter-voxel connection degree calculation means 4 for calculating a connection degree vector $\vec{C}(l,m,k)$ representing a connection degree between voxels adjacent to each other from the diffusion tensor data $D(l, m, k)$ which is acquired by the diffusion tensor data acquisition means 2; data evaluation value constitution means 5 for constituting a predetermined evaluation value Q from the time series data $\rho(l, m, k, i)$ of the brain function information which is preprocessed by the data preprocessing means 3, and the connection degree vector $\vec{C}(l,m,k)$, which is calculated by the inter-voxel connection degree calculation means 4; data analysis means 6 for performing a calculation to determine the extremum (minimum value in the present embodiment) of the data evaluation value Q; image generation means 7 for generating images based on the data which is calculated by the data analysis means 6; image display means 8 for displaying the images which are generated by the image generation means 7; memory means 9 composed of a sub memory for recording various data which is acquired, calculated, constituted, analyzed, and generated by the above respective means 2 to 8, and a main memory for storing a computer readable program for brain function analysis for executing each of steps explained in full detail henceforth; a CPU (Central Processing Unit) for controlling each of the above means 2 to 9 according to the program for brain function analysis which is read from the memory means 9; and the like. Incidentally, meaning of each of above-described symbols will be described below.

Here the MRI device 50 is composed of a magnet assembly which is composed of a static magnetic field coil for generating a static magnetic field for causing Nuclear Magnetic Resonance (NMR), a high frequency coil for irradiating high frequency waves of resonance frequency to detect a resonance signal, a gradient coil for generating a gradient magnetic field for encoding position information to a resonance signal, and the like; and a system controller for controlling energization of these coils; and the like, wherein the MRI device 50 generates various kinds of fMRI data (original time series data $\rho'(l, m, k, i)$ of the brain function information relevant to a blood flow volume, diffusion tensor data $D(l, m, k)$ relevant to a running direction of nerve fibers, or the like) according to requests of an operator thereof, and transmits these kinds of data to the brain function analysis apparatus 10. Note that in the present invention it is not always necessary to acquire the original time series data $\rho'(l, m, k, i)$ of the brain function data from the MRI device 50, but there may be employed a configuration of acquiring it from a non-invasive measuring apparatus, such as PET which can also generate various kinds of brain function data, instead of that.

Meanwhile, as for the image display means 8, various display units such as CRT displays, TFT displays, plasma displays, or the like, and various printers such as ink jet printers, laser printers, or the like are available, for example. In addition, the memory means 9 is composed of, for example, RAM (Random Access Memory), ROM (Read Only Memory), or the like. Further, the sub memory and the main memory of recording means 9 are separately composed, and thus the contents stored in the main memory may be stored in optical disks such as magnetic hard disks, floppy (registered trademark) disks, or CD-ROMs, magnetic tapes, memory chips, or the like.

Although the brain function analysis apparatus 10 employs a display console type in which major constitution means 10A of the present embodiment, the image display means 8, and the memory means 9 are integrated in the present embodiment, there may be employed such a configuration that the image display means 8, or the image display means 8 and the memory means 9 are separated from the major constitution means 10A as respectively independent image display unit and storage unit. The brain function analysis apparatus 10 is achieved by the computer in any constitutions, and each of the above means 2 to 9 is controlled according to the program for brain function analysis which is read from the memory means 9 by a CPU (Central Processing Unit) 100.

Here the computer refers to a unit which processes structured inputs in accordance with a predetermined rule to then structure and output processed results, and for example, a general-purpose computer, a supercomputer, a mainframe, a workstation, a microcomputer, a server, or the like is included therein. Additionally, it may be a configuration (for example, a distributed computer system) in which two or more computers connected through communication networks (for example, intranet, local area network (LAN)), wide area network (WAN), and communication networks composed of combinations thereof are composed of each other.

Figure 2:
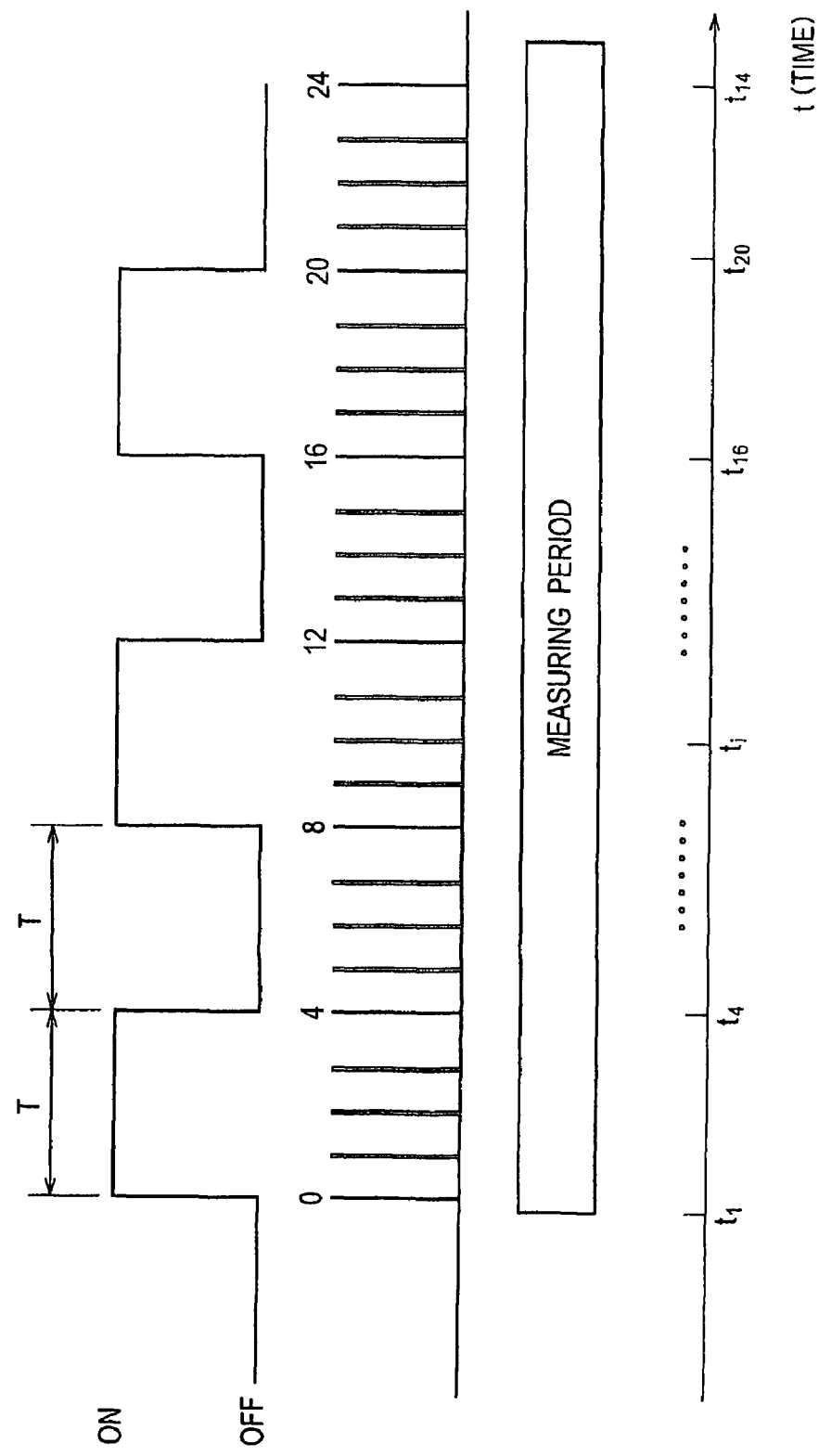
FIG. 2 is a view illustrating a method of typical fMRI measurement.
Figure 3:
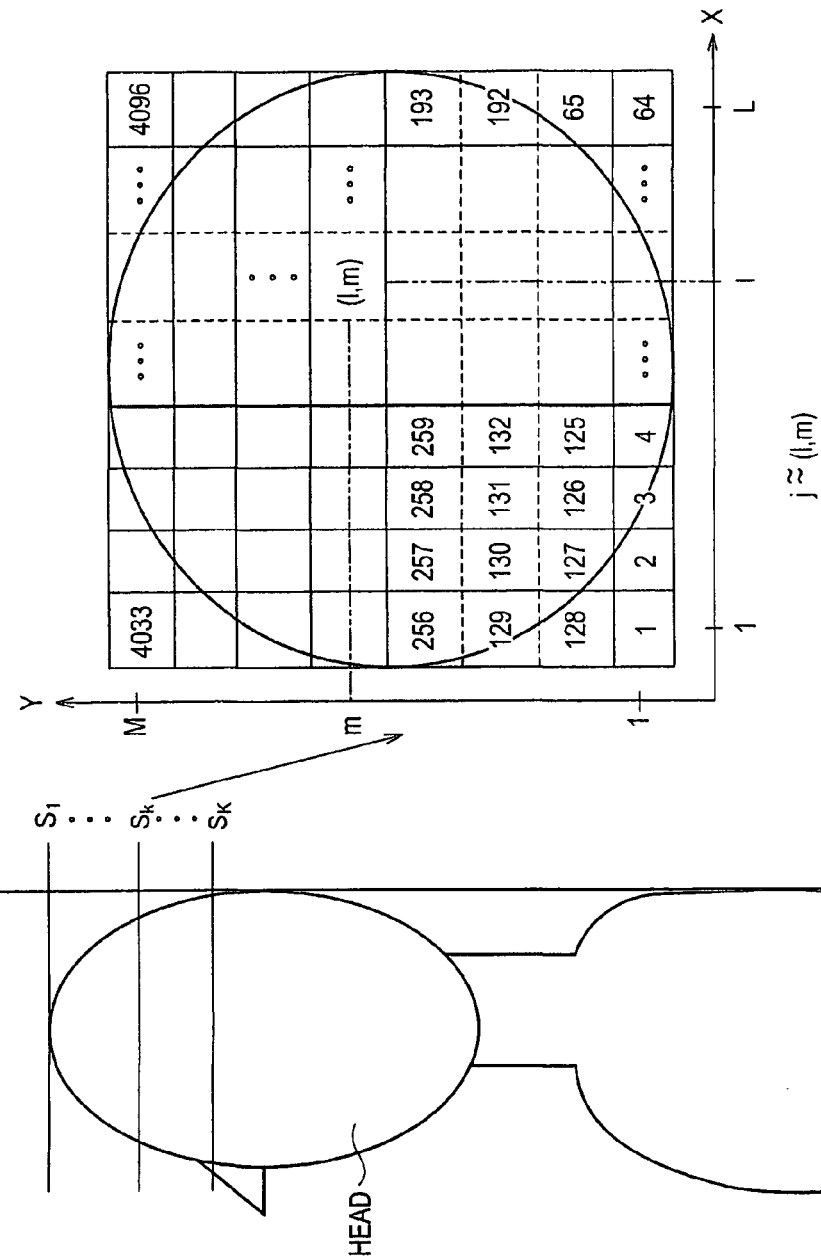

Next, in order to facilitate understanding of the present invention, an outline of a flow of the brain function analysis according to the present invention will be described using FIG. 2 through FIG. 7. FIG. 2 illustrates a method of typical fMRI measurement, FIG. 3 illustrates a typical fMRI image (two-dimensional slice image), FIG. 3A shows a head of a subject on a bed, and FIG. 3B shows voxels composing a two-dimensional cross section (two-dimensional slice image) of the head.

For example, it is considered a case where when letting the subject to perform a certain task (for example, tapping of fingers), regions in the brain to relevant to the task is located by the fMRI measurement. In the example shown in FIG. 2, there is shown a case where one set is repeated three times in one measurement, where one set is composed of a task of a certain period of time "T" and a rest of a certain period of time "T" the same as the task thereof. Here a horizontal axis is a time-axis, wherein "ON" indicates the task and "OFF" indicates the rest. fMRI measurement is usually performed several tens of times in one experiment. Although the fMRI measurement is performed 24 times in this example, images of the task start and the task end are not normally used in consideration of a lag of measurement time, so that it means that significant fMRI measurement has been performed 18 times (corresponding to 18 thick lines) actually. Incidentally, "$t_i$ (for i=1, 2, . . . , 24)" discretely shows actual times of the measurement. "$t_i$" will be hereinafter represented only as "i (for i=1, 2, . . . , I)" (positive discrete integer).

A two-dimensional slice image $S_k$ as shown in FIG. 3B is obtained as a result of such fMRI measurement. Here "k" indicates the number of two-dimensional slice images obtained by one experiment, and 20 to 30 two-dimensional slice images are obtained in the normal fMRI measurement (in the drawing, K=20 to 30). Although these two-dimensional slice images $S_k$ (for k=1, 2, . . . , K) are superficially described in FIG. 3B, they are actually composed of three-dimensional stereoscopic pixels called voxel. Although the two-dimensional slice image composed of 64×64 voxels is shown in the figure as one example, it may be, of course, a two-dimensional slice image divided into the different number of voxels. Although the voxel on an arbitrary two-dimensional slice image $S_k$ can generally be represented as (l, m) using two positive discrete variables of "l" and "m", this can also be represented with single positive discrete variable "j" by assigning a number thereto under a predetermined rule. Namely, it is mathematically possible to provide one-to-one correspondence between "j" and (l, m) (j≡(l, m) (for $S_k$)) under the predetermined rule. In this example, since an upper-limit "L" of "l" and an upper-limit "M" of "m" are both 64 (L=64, M=64), it results in j=1, 2, . . . , 4096. Hereinafter, these notations will be both used suitably according to the case. In addition, a circle shown in FIG. 3B represents an outline of a cross-sectional shape of the head.

FIG. 4 illustrates the time series data $\rho(j, k, i)$ ($\equiv \rho_k(j, i)$) of the brain function information on the voxel "j" composing a certain two-dimensional slice image $S_k$, which is acquired by the brain function data acquisition means 1 and pre-processed by the data preprocessing section 3 (will be described later), and $D(j, k)$ ($\equiv D_k(j)$) which is acquired by the diffusion tensor data acquisition means 2. As described in the background art, when the diffusion weighted image is generated by the DTI measurement, the original time series data $\rho'(l, m, k, i)$ ($\equiv \rho'_k(l, m, i)$) of the brain function information on the two-dimensional slice image $S_k$ and the diffusion tensor data $D(l, m, k)$ ($\equiv D_k(l, m)$) are typically obtained as a result of imaging by an ST pulse sequence obtained by adding STG pulses for diffusion detection to before and after an SE pulse. $\rho_k(j, i)$ represents the time series data of the brain function information which is obtained as a result of performing predetermined preprocessing, which will be described later, to this original time series data $\rho'_k(l, m, i)$. Namely, $\rho_k(j, i)$ in the drawing represents the brain function information at time "i" in the voxel "j" of a certain two-dimensional slice image $S_k$. Meanwhile, $D_k(j)$ represents the diffusion tensor information in the voxel "j" of the certain two-dimensional slice image $S_k$. $\rho_k(j, i)$ is specifically represented as a scalar, while $D_k(j)$ is represented in a matrix as shown in Equation (2), and they will take, for example, the following values:

$$\rho_k(j, i) = 5000, D_k(j) = \begin{pmatrix} 1.0 & 1.2 & 1.1 \\ 1.2 & 0.8 & 0.9 \\ 1.1 & 0.9 & 0.7 \end{pmatrix}. \tag{4}$$

Since the diffusion tensor is typically a symmetric tensor (non-diagonal elements are symmetrical) as shown in this example, it will substantially have six components. Additionally, CLASS in the drawing represents whether or not the task is performed, where "ON (=1)" and "OFF (=0)" correspond to "ON" and "OFF" shown in FIG. 2, respectively.

FIG. 5 is a table showing one example of the time series data $\rho_k(j, i)$ of the brain function information shown in FIG. 4. Although actual time series data of the brain function information $\rho_k(j, i)$ takes continuous values as illustrated in FIG. 5(A), once a value "4000" is set as an activity threshold, and then the data may be further binarized at the stage of the preprocessing such that a voxel value that takes a value larger than that is an activity "A", and a voxel value that takes a value smaller than that is an inactive "I", as shown in for example FIG. 5(B).

Figure 6:
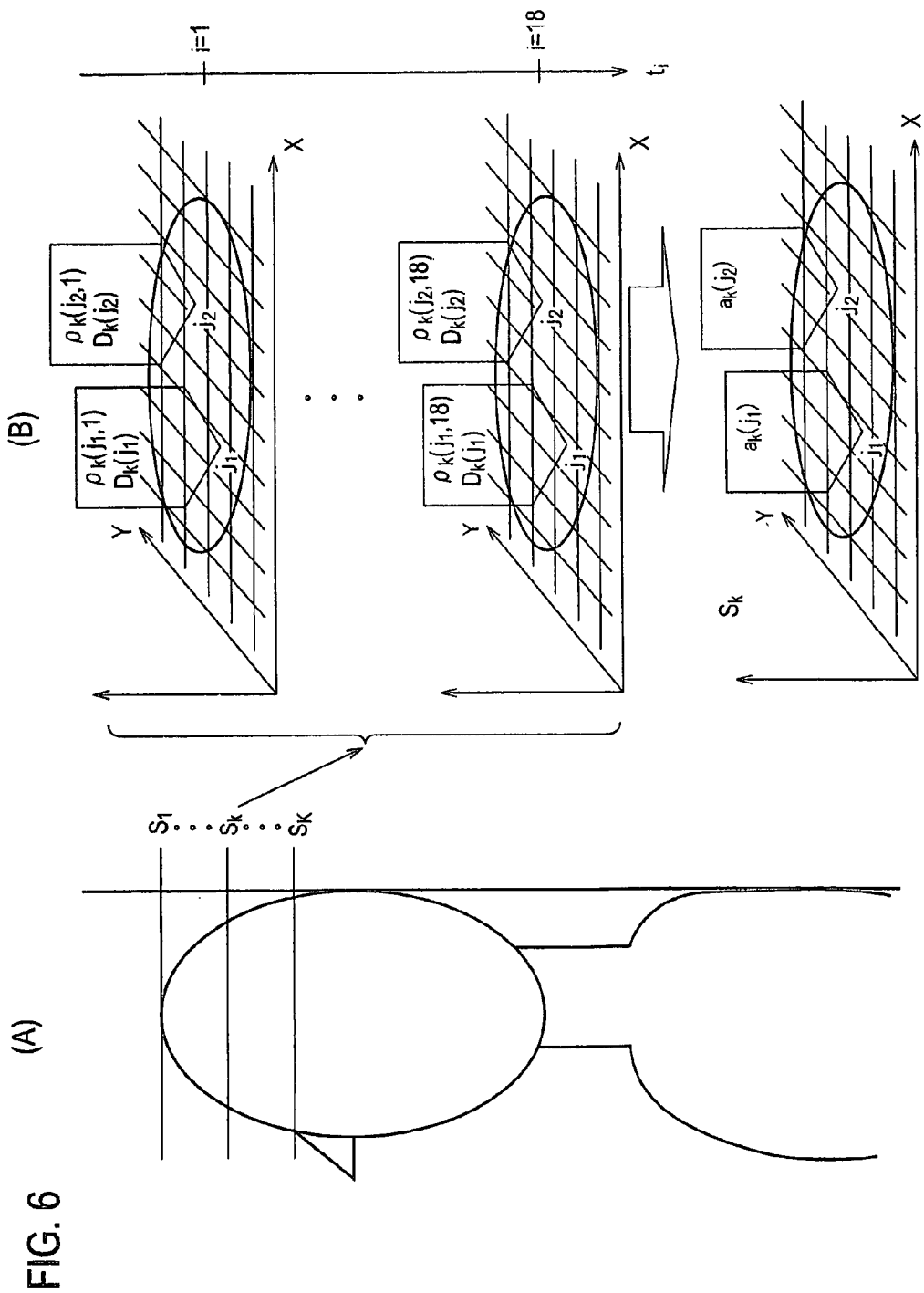
Figure 7:
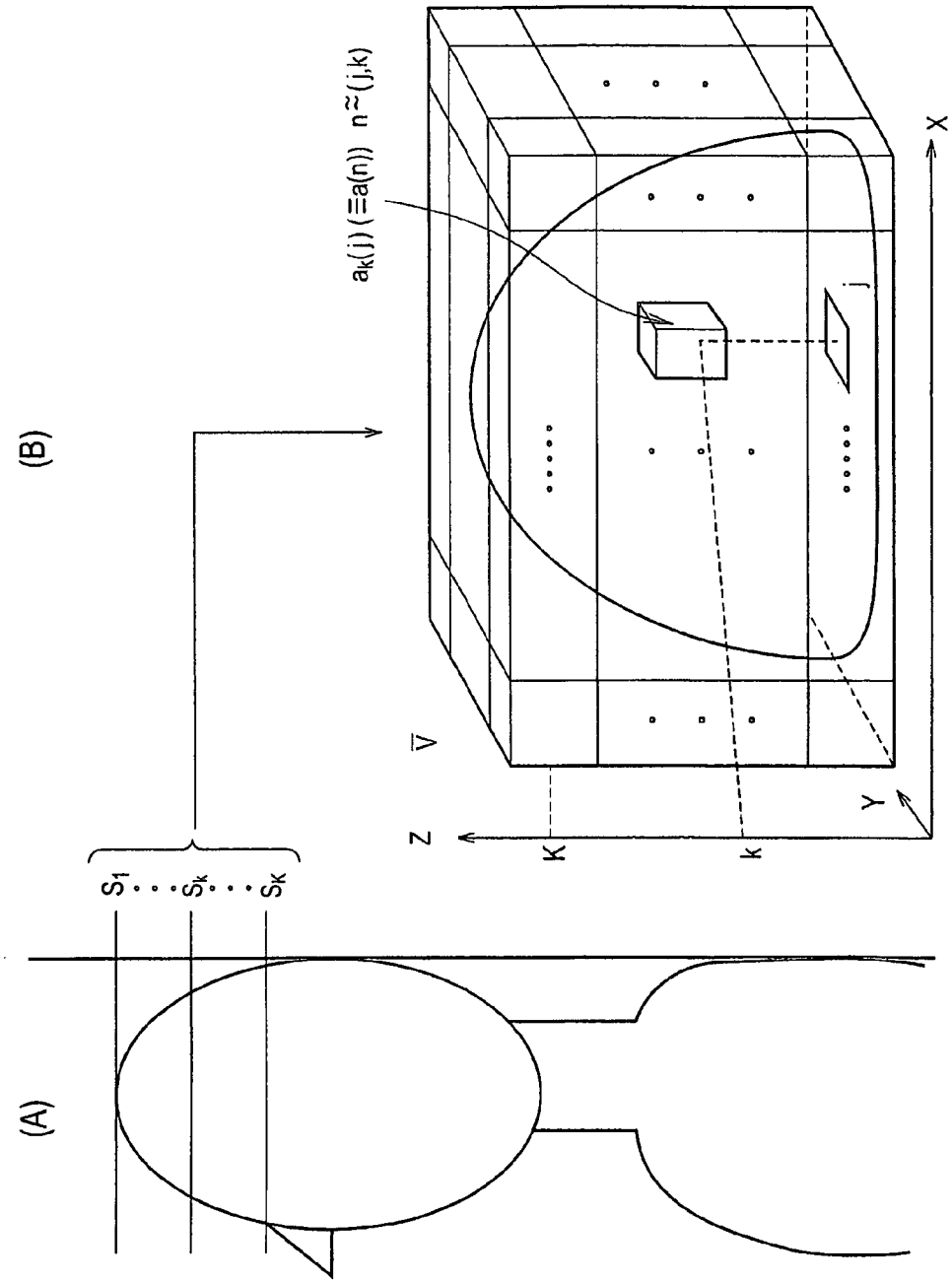

FIG. 6 is a view of a stereoscopic configuration of the diffusion tensor data $D_k(j)$ shown in FIG. 4 and the time series data $\rho_k(j, i)$ of the brain function information also shown in FIG. 4, wherein FIG. 6A shows the head of the subject on the bed, and FIG. 6B shows a procedure for generating a k-th two-dimensional slice image $S_k$ from the time series data and the diffusion tensor data of the brain function information shown in FIG. 4. Pentagons on voxels "j1" and "j2" in FIG. 6B illustrate internal spaces (namely, a scalar field and a tensor field on the voxel) on each voxel, to which the time series data $\rho_k(j, i)$ and the diffusion tensor data $D_k(j)$ of the brain function information shown in FIG. 4 attach.

For example, in SPM described in the background art, after performing preprocessing such as (a) Realignment: subsequent images are aligned with a top two-dimensional slice image (for example, S1), so that position compensation associated with movements of the head under measurement is carried out, and a false signal due to the movements is removed, (b) Spatial Normalization: in order to gather or compare data of a plurality of subjects, the data of each subject is adjusted to a Talairach standard brain, and (c) Smoothing: a Gaussian type filter is applied to a noisy original time series data, so that sensitivity of the analysis is improved without reducing spatial resolution, to the original time series data $\rho'_k(l, m, i)$ of the brain function information acquired from the MRI device 50, various kinds of test or the like are performed for every voxel, and significant active regions associated with the task are further tested between groups composed of a plurality of subjects, by personal data of the subject.

Further, in SPM an activity estimation model is prepared in advance, and how much the time series data $\rho_k(j, i)$ ($=\rho_k(l, m, i)$) of the function data pre-processed as described above matches with the model is subjected to a parameter estimation using a general linear model without using the diffusion tensor data $D_k(l, m)$.

Meanwhile, in the present invention, preprocessing (d) which will be explained in full detail hereinafter is performed on the original time series data $\rho'_k(l, m, i)$ of the brain function information using the diffusion tensor data $D_k(j)$ ($=D_k(l, m)$) acquired by the diffusion tensor data acquisition means 2, other than the above preprocessing. Subsequently, data processing which will be explained in full detail hereinafter is performed on the pre-processed time series data $\rho_k(j, i)$($=\rho_k(l, m, i)$) of the brain function information using the diffusion tensor data $D_k(j)$ ($=D_k(l, m)$), and thus two-dimensional image data $a_k(j)$($=a_k(l, m)$) which is a target of an image display is generated.

Note that although the two-dimensional slice image is described as an example for the purpose of simplification in the above, a stereoscopic image data $a_k(j)$ ($=a(j, k)=a(n)$) of the head as shown in FIGS. 7A and 7B is three-dimensionally subjected to data analysis in practice. The data processing using the diffusion tensor data $D_k(j)$ as will be explained in full detail hereinafter is performed also in that case. Here "n" is a positive discrete variable that represents the position of the voxel, in which numbers are assigned to all the voxels which are stereoscopically configured, under the predetermined rule. Although the variable "j" which represents the position of the two-dimensional slice image on an XY coordinate and the variable "k" which represents a direction of a third dimension (z direction) are separately described in the drawing, it is mathematically equivalent to represent this with above 1 variable "n" (n≡(j, k)). Note that a notation using 1 variable "n" and a notation using three variables (j, l, k) in an XYZ coordinate system for representing the same three-dimensional voxel will be both used suitably hereinafter (n≡(l, m, k)≡(j, k)).

Figure 8:
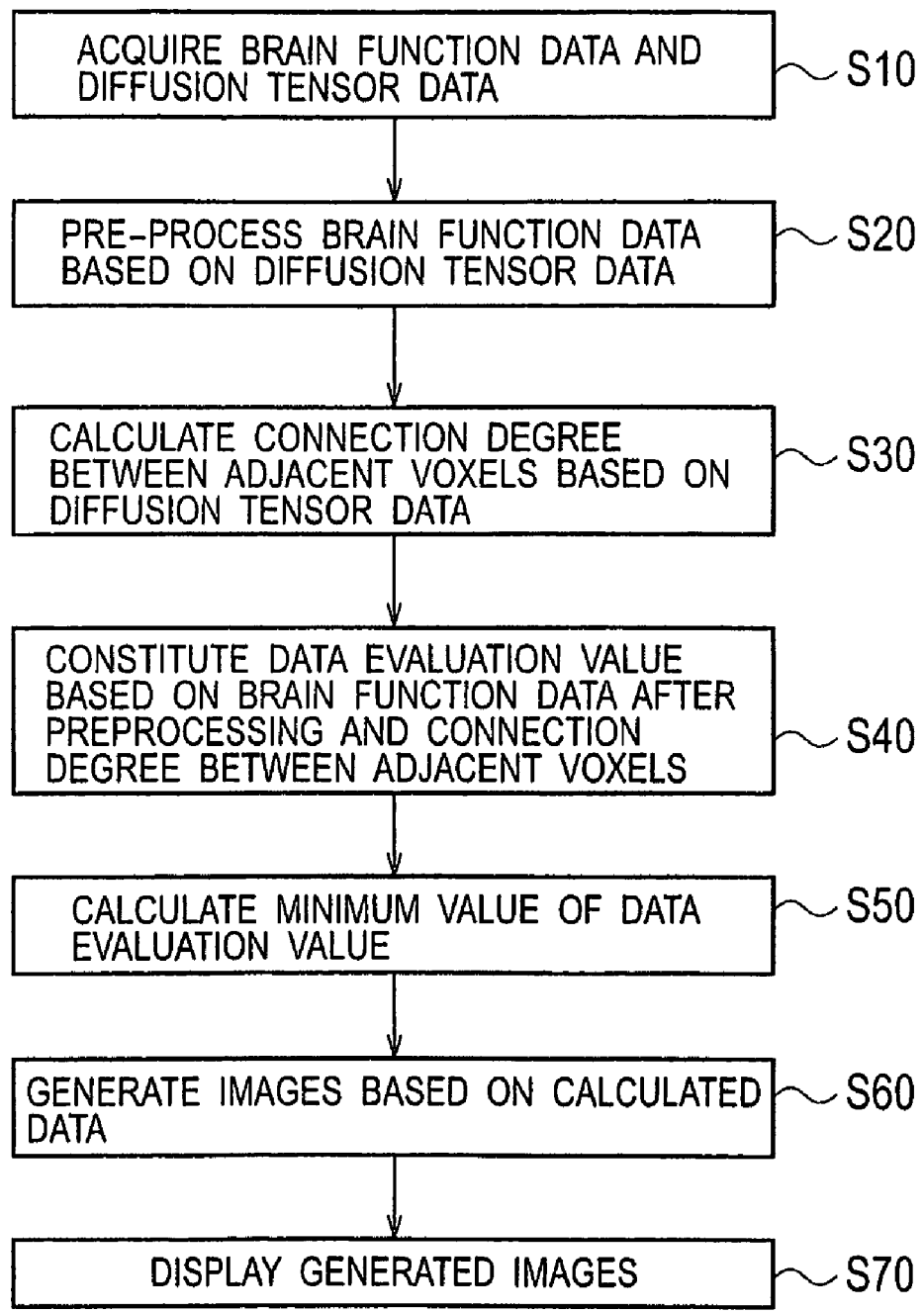
FIG. 8 is a flow chart showing one example of a data analysis procedure performed by the brain function analysis apparatus shown in FIG. 1.

A data analysis method performed by the brain function analysis apparatus 10 shown in FIG. 1 will be described in detail on the presupposition described above. FIG. 8 is a flow chart showing a data analysis procedure performed by the brain function analysis apparatus 10 shown in FIG. 1.

At Step S10, the brain function data acquisition means 1 acquires the original time series data $\rho'(l, m, k, i)$ of the brain function information measured by the MRI device 50. At the same step, the diffusion tensor information acquisition means 2 acquires the diffusion tensor data $D(l, m, k)$ measured also by the MRI device 50.

Next, the data preprocessing means 3 performs preprocessing such as position compensation, noise rejection, or the like represented by the above techniques (a) to (c) of SPM, on the original time series data $\rho'(l, m, k, i)$ of the brain function information acquired as described above at Step S20.

At the same step, in order to further perform the preprocessing (d) (data conversion to nerve signal) on the time series data $\rho'(l, m, k, i)$ of the brain function information to which the normal preprocessing is performed as described above, the data preprocessing means 3 calculates, for example, an eigenvector $\vec{v}_M(l,m,k)$ corresponding to the maximum eigenvalue $\lambda_M$ among eigenvectors $\vec{v}_\alpha(l,m,k)$ ($\alpha=1, 2, 3$) which satisfy the following eigen equation of the diffusion tensor data $D(l, m, k)$:

$$\mathbb{D}(l,m,k)\vec{v}_\alpha(l,m,k)=\lambda_\alpha\vec{v}_\alpha(l,m,k), \quad (5)$$

using the diffusion tensor data $D(l, m, k)$ acquired as described above.

For the purpose of simplification, it is assumed hereinafter that $|\lambda_1|\geqq|\lambda_2|\geqq|\lambda_3|$, and an eigenvector $\vec{v}_f(l,m,k)$ corresponding to $\lambda_1$ which is the maximum eigenvalue will be written as $\vec{v}_M(l,m,k)$. In addition, a norm of the eigenvector $\vec{v}_M(l,m,k)$ shall be normalized by 1.

Subsequently, at the same step, the data preprocessing means 3, with respect to a certain voxel (l, m, k), first determines an adjacent voxel corresponding a direction vector in which an absolute value of an inner product with the eigenvector $\vec{v}_M(l,m,k)$ on the voxel (l, m, k) becomes the maximum among 26 voxels (three dimension) which are adjacent to the voxel (l, m, k).

Figure 9:
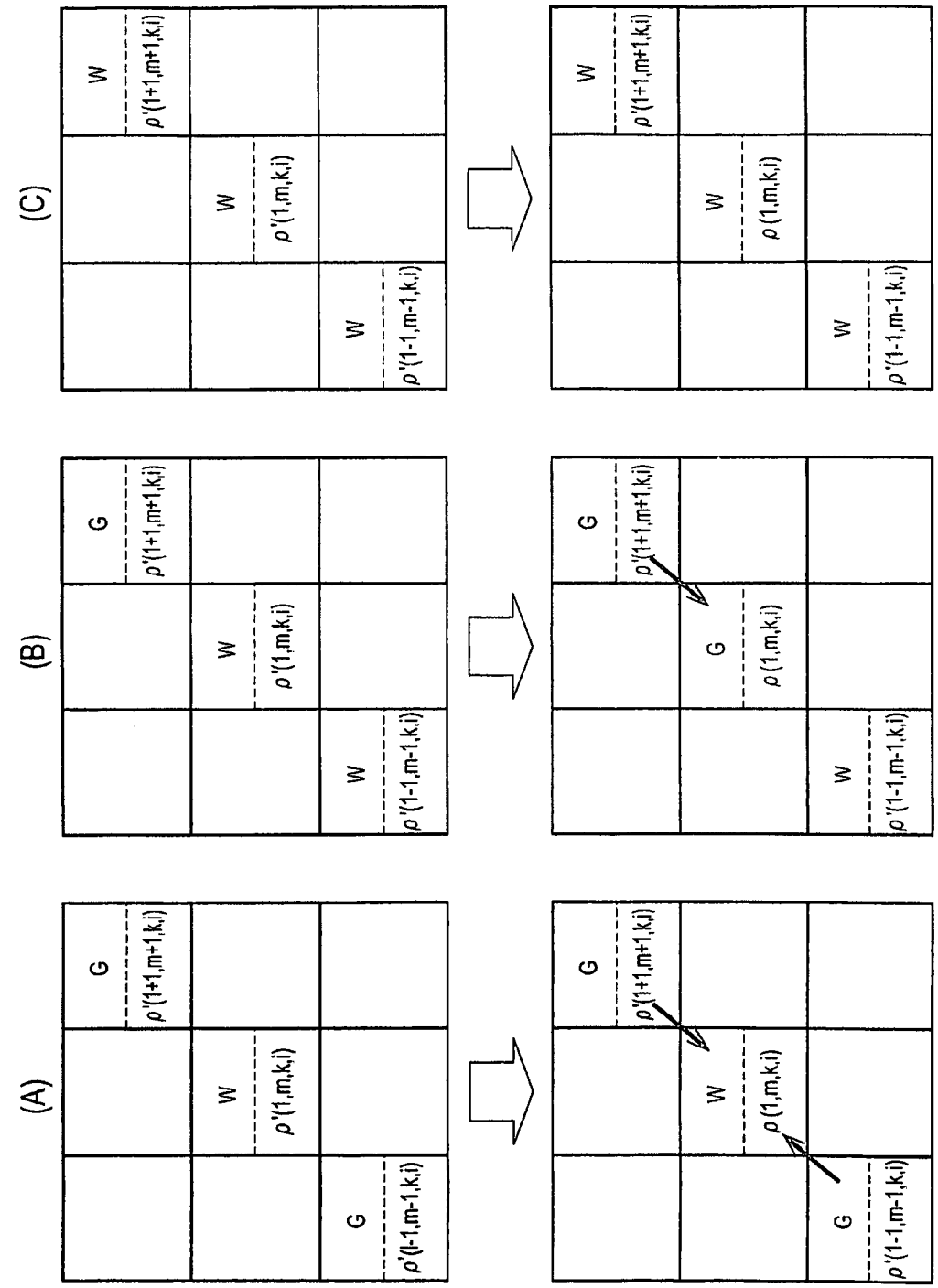

It is assumed that the adjacent voxel that satisfies this condition is (l+1, m+1, k), for example. An adjacent voxel having a point-symmetric relation with respect to the voxel thus determined about the voxel (l, m, k) is then determined. In this case, it is a voxel (l−1, m−1, k). This situation is shown in FIG. 9. Since the voxel (l+1, m+1, k) and the voxel (l−1, m−1, k) are voxels whose inner product with the eigenvector $\vec{v}_M(l,m,k)$ on the voxel (l, m, k) becomes the maximum as described above, it is considered that the connection with the voxel (l, m, k) is the strongest.

The reason is that if it is a case shown in FIG. 9(c), the voxel (l+1, m+1, k) and the voxel (l−1, m−1, k) about the voxel (l, m, k) can be regarded as the voxels on the nerve fibers running in the same running direction.

Next, at the same step, the data preprocessing means 3 rewrites the time series data $\rho'(l, m, k, i)$ of the brain function information on the voxel (l, m, k) according to following three kinds of situations.

(Situation 1) a case where the voxel (l+1, m+1, k) and the voxel (l−1, m−1, k) are both regarded as a gray matter (cell body of the neuron: G in the drawing) from the predetermined anatomical data of the brain (T1 weighted image acquired by the MRI device 50) acquired in advance (refer to FIG. 9(A)):

In this case, the value of the time series data $\rho'(l, m, k, i)$ of the brain function information on the voxel (l, m, k) is rewritten by $$\rho(l, m, k, i) = \frac{\rho'(l+1, m, +1, k, i) + \rho'(l-1, m-1, k, i)}{2}. \quad (6)$$

(Situation 2) a case where the voxel (l+1, m+1, k) (or the voxel (l−1, m−1, k)) is regarded as a gray matter from the predetermined anatomical data of the brain (T1 weighted image acquired by the MRI device 50) acquired in advance (refer to FIG. 9(B)):

In this case, the value of time series data ρ'(l, m, k, i) of the brain function information on the voxel (l, m, k) is rewritten by $$\rho(l,m,k,i)=\rho'(l+1,m+1,k,i)(\text{or } \rho'(l-1,m-1,k,i)). \quad (7)$$

(Situation 3) a case where the voxel (l+1, m+1, k) and the voxel (l−1, m−1, k) are neither regarded as a gray matter (namely, regarded as a white matter (nerve fiber of the nerve: W in the drawing)) from the predetermined anatomical data of the brain (T1 weighted image acquired by the MRI device 50) acquired in advance (refer to FIG. 9(C)):

In this case, the value of time series data ρ'(l, m, k, i) of the brain function information on the voxel (l, m, k) is rewritten by $$\rho(l, m, k, i) = \\ \frac{\rho'(l+1, m, +1, k, i) + \rho'(l, m, k, i) + \rho'(l-1, m-1, k, i)}{3}. \quad (8)$$

Such processing is performed on all the voxels. As a result of this, the value of the time series data of the brain function information on the voxel (gray matter voxel) regarded as the gray matter can be reflected (transmitted) to the value of the time series data of the brain function information on the adjacent voxel (white matter voxel) regarded as the white matter as shown in lower figures of FIGS. 9(A) and (B). Furthermore, when the voxels regarded as the white matter are adjacent to each other as shown in lower figure of FIG. 9(C), values of the brain function data on these voxels will be smoothed. Effects of subsequent steps can be accentuated by performing such preprocessing.

Note that, how to performing such preprocessing (d) is not limited to the example described above, but the white matter voxel which is adjacent to the gray matter voxel and receives the value of the time series data of the brain function information of the gray matter voxel may further transmit the value sequentially to the adjacent white matter voxel in a procedure similar to that described above, for example. Moreover, it may be configured such that a weighted value is passed according to the diffusion tensor data D(l, m, k) when the value of the time series data of the brain function information of the gray matter voxel is passed to the white matter voxel as described above. Further, a larger value between the value of the white matter voxel rewritten in the above-described procedure and the original value of the white matter voxel may be set as the value of the white matter voxel.

Next, at Step S30, based on the above-described diffusion tensor data:

$$D(l, m, k) = \begin{pmatrix} D_{ll}(l, m, k) & D_{lm}(l, m, k) & D_{lk}(l, m, k) \\ D_{lm}(l, m, k) & D_{mm}(l, m, k) & D_{mk}(l, m, k) \\ D_{lk}(l, m, k) & D_{mk}(l, m, k) & D_{kk}(l, m, k) \end{pmatrix}, \quad (9)$$

the inter-voxel connection degree calculation means 4 calculates a connection degree vector:

$$\vec{C}(l,m,k)=(c_l(l,m,k),c_m(l,m,k),c_k(l,m,k))^T \quad (10)$$

between voxels adjacent to each other from, for example, $$\vec{C}(l,m,k)=(1-\alpha)\vec{1}+\alpha\vec{D}'(l,m,k). \quad (11)$$

Here each component of $$\vec{D}'(l,m,k)=(D'_l(l,m,k),D'_m(l,m,k),D'_k(l,m,k))^T \quad (12)$$

is defined as, for example, $$\vec{D}'_l(l, m, k) = \frac{D_l(l, m, k) + D_l(l+1, m, k)}{2}, \quad (13)$$

$$\vec{D}'_m(l, m, k) = \frac{D_m(l, m, k) + D_m(l, m+1, k)}{2},$$

$$\vec{D}'_k(l, m, k) = \frac{D_m(l, m, k) + D_m(l, m, k+1)}{2}.$$

This is called an averaged diffusion degree vector between adjacent voxels hereinafter. Also, "α" is a parameter to satisfy $$0 \leq \alpha \leq 1, \quad (14)$$

and $\vec{1}$ is a constant vector to satisfy $$\vec{1}=(1,1,1)^T. \quad (15)$$

In Equation (13), $$\vec{D}(l,m,k)=(D_l(l,m,k),D_m(l,m,k),D_k(l,m,k))^T \quad (16)$$

is a vector to represent a degree of diffusion of protons (this will be hereinafter called a diffusion degree vector), wherein a first component $D_l$(l, m, k) represents a degree of diffusion of protons in the X-axis direction in the voxel of a position (l, m, k), a second component $D_m$(l, m, k) represents a degree of diffusion of protons in the Y-axis direction in the voxel of the position (l, m, k), and a third component $D_k$(l, m, k) represents a degree of diffusion of protons in the Z-axis direction in the voxel of the position (l, m, k). Here the X, Y, and Z directions are assumed to be the same directions as those shown in FIG. 7, respectively. Incidentally, it is premised in Equation (9) that the diffusion tensor is a symmetric tensor.

Using the diffusion degree vector $\vec{D}$(l,m,k) having such implications, each components $C_l$(l, m, k), $C_m$(l, m, k), and $C_k$(l, m, k) of the connection degree vector $\vec{C}$(l,m,k) between adjacent voxels composed as Equation (11) via Equation (13) represent a connection degree between the voxel of the position (l, m, k) and the voxel of the position (l+1, m, k), a connection degree between the voxel of the position (l, m, k) and the voxel of the position (l, m+1, k), and a connection degree of the voxel of the position (l, m, k) and the voxel of the position (l, m, k+1), respectively.

Note that in the present embodiment, although a connection degree between voxels which are adjacent to each other in an oblique direction (for example, voxel (l, m, k) and voxel (l+1, m+1, k)) is not directly taken into consideration, it is indirectly taken into consideration via a voxel in a perpendicular direction (voxel (l+1, m, k) or voxel (l, m+1, k) in this case). Needless to say, it may be configured such that the connection degree between the voxels which are adjacent to each other in the oblique direction is directly taken into consideration.

Further, as the diffusion degree vector $\vec{D}(l,m,k)$, for example, (I) in an ellipsoid model, $$D_l(l, m, k) = \sqrt{\frac{2|D|}{D_{mm}(l, m, k)D_{kk}(l, m, k) - D_{mk}(l, m, k)^2}},$$

$$D_m(l, m, k) = \sqrt{\frac{2|D|}{D_{ll}(l, m, k)D_{kk}(l, m, k) - D_{lk}(l, m, k)^2}},$$

$$D_k(l, m, k) = \sqrt{\frac{2|D|}{D_{mm}(l, m, k)D_{mm}(l, m, k) - D_{lm}(l, m, k)^2}}$$

(17)

is employed. Here $|D|$ represents a determinant of a matrix represented with Equation (9).

In addition, for example, (II) using diagonal elements $D_{ll}(l, m, k)$, $D_{mm}(l, m, k)$ and $D_{kk}(l, m, k)$ of the matrix represented with Equation (9), $$D_l(l,m,k)=|D_{ll}(l,m,k)|, D_m(l,m,k)=|D_{mm}(l,m,k)| \text{ and}$$
$$D_k(l,m,k)=|D_{kk}(l,m,k)|$$

(18)

may be employed.

Moreover, for example, (III) using an index representing a diffusion anisotropy typified by FA(Fractional Anisotropy):

$$\sqrt{\frac{3}{2} \cdot \frac{\sum_{a=1}^{3}(\lambda_a - D_{AV})^2}{\sum_{a=1}^{3} \lambda_a^2}}$$

(19)

and RA(Relational Anisotropy):

$$\frac{1}{\sqrt{6}} \sqrt{\frac{\sum_{a=1}^{3}(\lambda_a - D_{AV})^2}{D_{AV}}},$$

(20)

the diffusion degree vector $\vec{D}(l,m,k)$ may also be determined. Here DAV is $$D_{AV} = \frac{\sum_{a=1}^{3} \lambda_a}{3}.$$

(21)

In addition to these, (IV) it is also possible that the white matter voxel and the gray matter voxel of the brain are determined from the pre-determined anatomical data of the brain (T1 weighted image acquired by the MRI device 50) acquired in advance, and then the degree of diffusion vector of the above (I) is used in the white matter voxel, while the other degree of diffusion vector (for example, the above (II) or (III)) is used in the gray matter voxel.

As described above, as the diffusion degree vector $\vec{D}(l,m,k)$ in the present invention, any vectors may be used as far as it is a quantity capable of specifying the running direction of the nerve fiber from the diffusion tensor data D(l, m, k) acquirable from the MRI device 50.

In addition, instead of inequality (14) relevant to the parameter $\alpha$, the value of parameter $\alpha$ may be set so as to be switched between the gray matter voxel and the white matter voxel, for example, such that it becomes a large value in the gray matter voxel and a small value in the white matter voxel.

Furthermore, instead of the connection degree vector $\vec{C}(l,m,k)$ of Equation (11), $$\vec{C}(l,m,k)=\vec{1}+\alpha\vec{D}'(l,m,k)$$

(22)

may be used.

Further, in order to emphasize the running direction of the nerve fibers, a value obtained by raising each components $c_l(l, m, k)$, $c_m(l, m, k)$ and $c_k(l, m, k)$ of the connection degree vector $\vec{C}(l,m,k)$ of Equation (11) or Equation (22) to the N-th power (N is a natural number of two or more) may be employed.

In addition, values obtained by multiplying values of these components by a may be in the white matter voxel, and values obtained by multiplying values thereof by b may be used in the gray matter voxel. Moreover, only the largest component among these components may be emphasized by the above-described method. Further, only the component which has the value equal to or more than $\{c_l(l, m, k)+c_m(l, m, k)+c_k(l, m, k)\}/3$ may be emphasized by the above-described method.

Still further, the connection degree vector $\vec{C}(l,m,k)$ may be constituted such that the gray matter voxel is connected to only six adjacent voxels (six directions), and then the white matter voxel is connected to only a voxel whose inner product with the eigenvector corresponding to the maximum eigen-value of eigen equation (5) is the maximum, and with a voxel having of a point symmetry relation thereof (two directions).

Next, at Step S40, in order to subject the data illustrated in FIG. 5(A) to a nonparametric regression analysis from the time series data $\rho(l, m, k, i)$ of the brain function information pre-processed at Step S20 and the connection degree vector $\vec{C}(l,m,k)$ calculated at Step S40, for example, if there are six adjacent voxels, the data evaluation value constitution means 5 constitutes a data evaluation value Q:

$$Q(l, m, k) = \frac{1}{I}\sum_{i=1}^{I}\{\phi(i) - \hat{\phi}(i)\}^2 + \kappa\left[\sum_{l=1}^{L-1}C_l(l, m, k)\{\hat{a}(l+1, m, k) - \hat{a}(l, m, k)\}^2 + \sum_{m=1}^{M-1}C_m(l, m, k)\{\hat{a}(l, m+1, k) - \hat{a}(l, m, k)\}^2 + \sum_{k=1}^{K-1}C_k(l, m, k)\{\hat{a}(l, m, k+1) - \hat{a}(l, m, k)\}^2\right].$$

(23)

Here "i" is time, "l", "m" and "k" are variables representing the positions of the X direction, the Y direction, and the Z direction of the voxel, respectively, is as described in the above. Note that since there may be a voxel which does not represent the brain (nerve) among the stereoscopically con-figured voxels shown in FIG. 7 in practice, "l", "m", "k" relevant to that area shall be excepted. Meanwhile, $\phi(i)$ is time series data of a variable representing CLASS in FIG. 5(A), and has two values of 1 (=ON) and 0 (=OFF) in this case. In the nonparametric regression analysis in accordance with the present embodiment, while the time series data $\rho(l, m, k, i)$ of the brain function information as shown in FIG. 5(A) is an explaining variable, and the time series data ϕ(i) of a variable representing CLASS is an explained variable, it is assumed a linear regression equation:

$$\hat{\phi}(i) = \sum_{l=1}^{L}\sum_{m=1}^{M}\sum_{k=1}^{K} \hat{a}(l, m, k)\rho(l, m, k, i) \qquad (24)$$

between these variables in which â(l,m,k) is used as a regression coefficient. Here $\hat{\phi}$ and â represent estimation solutions, respectively, and κ is a weight parameter representing continuity between voxels adjacent to each other.

Although Equation (23) constitutes the evaluation value based on the continuity between adjacent voxels as described above, the evaluation value based on smoothness between adjacent voxels may be constituted instead of that.

Grounds using the nonparametric regression analysis as the data analysis technique in the present embodiment are that the number of explained variables ϕ(i) is extremely small as compared with the number of explaining variables ρ(l, m, k, i). In the example shown in FIG. 5(A), there are 64×64× 64=262144 explaining variables ρ(l, m, k, i) the same as the number of voxels, whereas the number of measured values of the explained variable ϕ(i) is 18. The number of measured values of the explained variable is 10 in number in a normal case, and may exceed 100. Since the normal regression analysis cannot be performed in such a situation, the nonparametric regression analysis is used in the present embodiment (Non-patent Document 6: "Spline Smoothing and Nonparametric Regression", R. L. Eubank, Marcel Dekker, Newyork, 1988).

Usually, in the nonparametric regression analysis, $\hat{\phi}(i)$ which minimizes following evaluation value Q':

$$Q' = \frac{1}{I}\sum_{i=1}^{I}\{\phi(i) - \hat{\phi}(i)\}^2 + \kappa\sum_{i=1}^{I-1}\{\hat{\phi}(i+1) - \hat{\phi}(i)\}^2 \qquad (25)$$

is determined by assuming continuity in the explained variable ϕ(l, m, k, i). Here the first term of the right-hand side is a term indicating an error from the estimated solution $\hat{\phi}(i)$ of the explained variable ϕ(i) at each time "i", and the second term thereof is a term for evaluating the continuity to a time direction of the explained variable ϕ(i).

However, the continuity cannot be assumed with respect to the value of the explained variable ϕ(i) as can be seen form the example shown in FIG. 5(A). For that reason, the data evaluation value Q represented by Equation (23) is constituted based on an enhanced nonparametric regression analysis so as to impose constraints of such continuity not to the explained variable ϕ(i) but to the explaining variable ρ(l, m, k, i) (Non-patent Document 7: "Nonparametric regression analysis of brain function images", H. Tukimoto et al., Institute of Electronics, Information and Communication Engineers D-II, Vol. J84, No. 12, pp 2623-2633, December, 2001) in the present embodiment.

Here, the meaning of Equation (23) will be described. The first term of the right-hand side is a term indicating an error from the estimated solution $\hat{\phi}(i)$ of the explained variable ϕ(i) at each time "i", which is the same as that in Equation (25).

The second term to the fourth term are terms indicating the continuity of effects for the adjacent voxels to have on the explained variable ϕ(i), and this continuity can be evaluated by effects for adjacent explaining variables ρ(l, m, k, i) to have on the explained variable, namely, the continuity of the regression coefficient â(l,m,k) of Equation (24).

Further, in the present embodiment, each components $C_l$(l, m, k), $C_m$(l, m, k), and $C_k$(l, m, k) of the connection degree vector $\vec{C}$(l,m,k) calculated by the inter-voxel connection degree calculation means 4 are introduced as a weighting factor to the continuity between adjacent voxels with respect to the X direction, the Y direction and the Z direction, in the second term to the fourth term, respectively.

Since these components are a function of each components $D'_l$(l, m, k), $D'_m$(l, m, k) and $D'_k$(l, m, k) of the averaged diffusion degree vector $\vec{D}'$(l,m,k), respectively, as shown in Equation (11), the data evaluation value Q of Equation (23) will result in reflecting the running direction (diffusion anisotropy of proton) of the nerve fiber (neuron).

Next, at Step S50, the data analysis means 6 performs calculation for determining the extremum of the data evaluation value Q constituted at Step S40. A regression coefficient â(l,m,k) which minimizes the data evaluation value Q of Equation (23) is calculated in the present embodiment.

For the purpose of simplification, a data evaluation value Q" obtained by rewriting Equation (23) will be hare described as $$Q''(n') = \frac{1}{I}\sum_{i=1}^{I}\{\phi(i) - \hat{\phi}(i)\}^2 + \kappa\sum_{n=1}^{L^3-1} C(n)\{\hat{a}(n') - \hat{a}(n)\}^2 \qquad (26)$$

where "n" is a positive discrete variable representing a position of a voxel that is one-dimensionally re-arranged by assigning a predetermined number to all the stereoscopically configured voxels, and has a one-to-one correspondence with three display variables (l, m, k). Further, since it is set as L=M=K for the purpose of simplification, the total number of voxels is $L^3$. Meanwhile, C (n) is a coefficient representing a connection degree between a voxel n and a voxel n' adjacent to the voxel n when all the voxels are one-dimensionally rearranged in this way, and this coefficient is uniquely determined from the connection vector $\vec{C}$(l,m,k) of Equation (11).

For example, when the discussion is limited to the two-dimensional slice image $S_k$ shown in FIG. 3(B), voxels adjacent to a voxel of n=130 are four of n=127, 129, 131, 257. According to the connection degree vector $\vec{C}$(l,m,k) calculated at Step S30, a connection degree between the voxel n=127 and the voxel n=130, a connection degree between the voxel n=129 and the voxel n=130, a connection degree between the voxel n=131 and the voxel n=130, and a connection degree between the voxel n=257 and the voxel n=130 are determined as, for example, 2, 2, 5, and 5, respectively.

Namely, in this case,

2{â(127)−â(130)}², 2{â(129)−â(130)}²,
5{â(131)−â(130)}², 5{â(257)−â(130)}² are obtained.

At this time, using a least square method, a regression coefficient â(n) can be determined as $$\hat{a} = (X^T X + I\kappa_O C)^{-1} X^T \vec{\phi} \qquad (27)$$

where X is a $L^3$×I matrix X having a component of ρ(n, i), $\vec{\phi}$ is an I-dimensional vector having a component of ϕ(i), $\vec{a}$ is an $L^3$-dimensional vector having a component of â(n), $\kappa_O$ is the optimum value of κ determined by a Cross Validation method, namely, κ which minimizes $$CV = \frac{1}{I} \sum_{i=1}^{I} \{\phi(i) - \hat{\phi}_{[i]}\}^2. \tag{28}$$

Here $\hat{\phi}_{[i]}$ is a value obtained by calculating a regression coefficient except for i-th case to thereby predict a measured value of i-th case using the regression coefficient.

Next, at Step S60, the image generation means 7 generates images to which a color tone such that a voxel whose regression coefficient value is positive (namely, positive correlation) is set to a color tone in a white direction, and a voxel whose regression coefficient value is negative (namely, negative correlation) is set to a color tone in a black direction, for example, using a voxel whose regression coefficient value is 0 (namely, no correlation) as a standard of a grayscale is applied, based on the regression coefficient â(n) calculated as above.

In addition to that, values of top 5% or more in a frequency histogram of the voxel values which can be taken on the grayscale may be displayed, or full color images may be generated in accordance with a predetermined rule.

Subsequently, at Step S70, the image display means 8 stereoscopically displays the images generated as described above.

As described above, in the first embodiment, in addition to the evaluation term of the error based on the time series data of the brain function information acquired from the MRI device, the evaluation value, to which the evaluation term of the continuity in the space direction based on the diffusion tensor data acquired also from the MRI device is added, is constituted. The evaluation term has been subjected to the nonparametric linear regression analysis and the resultant regression coefficient has been set to a target of the image display, thus allowing activated brain regions to be located in consideration of the connection structure between the activated brain regions as well.

Incidentally, although the process of the preprocessing (d) is provided at Step S20 other than the normal preprocessing (a) to (c) in the present embodiment, the preprocessing (d) may be removed. This is similar also to subsequent embodiments.

Incidentally, although Equation (23) is constituted as the data evaluation value in the first embodiment, various kinds of evaluation values can be constituted depending on the data analysis technique in achieving the object of the present invention. Hence, while several modified examples of the above first embodiment will be then described, only portions different from those of the first embodiment will be hereinafter described in order to avoid duplication.

Modified Example 1 of First Embodiment

In the first embodiment, the data analysis means 6 performs the nonparametric regression analysis by using the linear regression equation of Equation (19) at Step S50, but more strictly, it is also considered that the regression expression is performed with general n-dimensional functions, such as a quadratic function, a cubic function, or the like. Upon performing such a nonlinear regression analysis, Neural Network models can be used. As a typical Neural Network model, there is a hierarchical type Neural Network model composed of an input layer, a middle layer, and an output layer.

In the present modified embodiment, at Step S40 the data evaluation value constitution means 5 constitutes an evaluation value, in which an evaluation value for evaluating the continuity between adjacent voxels based on the connection degree vector $\vec{C}(l,m,k)$ calculated by the inter-voxel connection degree calculation means 4 is added to a term of a square error which is an evaluation value of normal learning in the Neural Network model.

Subsequently, after the data analysis means 6 performs an analysis at Step S50 using an Error Back Propagation Method or the like in order to determine the minimum value of the evaluation value thus constituted, the image generation means 7 generates at Step S60 sensitivity (effects having on an output when an input is changed) between the input (time series data of the brain function information) and the output as the display image in a manner similar to that of the first embodiment. Thereafter, at Step S70, the image display means 8 stereoscopically displays the images generated as described above.

This makes it possible to obtain effects similar to those of the first embodiment.

Modified Example 2 of First Embodiment

The data evaluation value constitution means 5 constitutes at Step S40 the evaluation value Q of Equation (23) using the time series data $\rho(l, m, k, i)$ of the brain function as the explaining variable, and $\phi(i)$ as the explained variable in the first embodiment, whereas, in the present modified embodiment, an evaluation value Q''', for example, $$Q''' = \frac{1}{I} \sum_{i=1}^{I} \{\rho(l, m, k, i) - \hat{\rho}(l, m, k, i)\}^2 + \tag{29}$$

$$\frac{\kappa}{I} \sum_{i=1}^{I} [C_l(l, m, k)\{\hat{\rho}(l+1, m, k, i) - \hat{\rho}(l, m, k, i)\}^2 +$$

$$C_m(l, m, k)\{\hat{\rho}(l, m+1, k, i) - \hat{\rho}(l, m, k, i)\}^2 +$$

$$C_k(l, m, k)\{\hat{\rho}(l, m, k+1, i) - \hat{\rho}(l, m, k, i)\}^2]$$

is constituted for every voxel (l, m, k) by using the reverse relationship, namely, using $\phi(i)$ as the explaining variable, and $\rho(l, m, k, i)$ as the explained variable. Here the following constraint condition:

$$\hat{\rho}(l, m, k, i) = \sum_{l=1}^{L} \sum_{m=1}^{M} \sum_{k=1}^{K} \hat{a}(l, m, k)\phi(i) + b \tag{30}$$

is given.

Subsequently, at Step S50 the data analysis means 6 determines an optimal κ using the Cross Validation method in order to determine the minimum value of the evaluation value Q''' constituted as described above, and determines a regression coefficient â(l,m,k) using a probabilistic search algorithm, such as GA (Genetic Algorithm).

Next, at Step S60, the image generation means 7 generates a value based on the brain function data $\rho(l, m, k)$ of the voxel, which is determined to be significant upon variously testing the above-described analysis results, as the display image. Thereafter, at Step S70, the image display means 8 stereoscopically displays the images generated as described above.

This makes it possible to obtain effects similar to those of the first embodiment.

Modified Example 3 of First Embodiment

The data evaluation value constitution means 5 constitutes at Step S40 the evaluation value of Equation (23) using the time series data ρ(l, m, k, i) of the brain function as the explaining variable, and φ(i) as the explained variable in the modified example 1 of the first embodiment, whereas, in the present modified embodiment, the nonlinear regression analysis can also be performed using the hierarchical type Neural Network model, by using the reverse relationship, namely using φ(i) as the explaining variable, and ρ(l, m, k, i) as the explained variable. Note that since the Error Back Propagation Method cannot be used upon determining the extremum at Step S50 in this case, the data analysis means 6 determines the optimal κ using the Cross Validation method instead, and performs the data analysis by the probabilistic search algorithm, such as GA. Subsequently, at Step S60, the image generation means 7 generates a value based on the brain function data ρ(l, m, k) of the voxel, which is determined to be significant upon variously testing the above-described analysis results, as the display image. Thereafter, at Step S70, the image display means 8 stereoscopically displays the images generated as described above.

This makes it possible to obtain effects similar to those of the first embodiment.

Modified Example 4 of First Embodiment

While the data analysis means 6 performs the nonparametric regression analysis by using the linear regression equation of Equation (24) at Step S50 in the first embodiment, classificational analysis techniques, such as, a discriminant analysis (Non-patent Document 8: "Story of multivariate analysis", T. Arima, S. Ishimura, Tokyo Tosho, 1987), a quantification II (Non-patent Document 9), a decision tree (Non-patent Document 10: "Data analysis by A.I.", J. R. Quinlan, Toppan, 1995), a support vector machine (Non-patent Document 11: "Introduction to support vector machine", Nello Cristianini and John Shawe-Taylor, Kyoritsu shuppan, 2005) or the like may also be used as the data analysis technique.

In any case, data classification is performed using various kinds of discrimination functions, decision trees, or the like, while using the explaining variable as the time series data ρ(l, m, k, i) of the brain function information, and the external criterion as the time series data of the task and the rest, for example. In the present modified embodiment, the data evaluation value constitution means 5 constitutes at Step S40 an evaluation value in which the connection degree vector $\vec{C}$(l,m,k) calculated at Step S30 is incorporated into a normal evaluation value in each analysis techniques in that case.

Subsequently, at Step S50, the data analysis means 6 then performs the data analysis using each analysis technique. If the evaluation value is changed as described above, the normal solution method may not be used, and thus the data analysis means 6 may determine the optimal κ using the Cross Validation method, and perform the data analysis by the probabilistic search algorithm, such as GA in that case.

Subsequently, at Step S60, the image generation means 7 generates a value based on the brain function data ρ(l, m, k) of the voxel, which is determined to be significant upon variously testing the classification data obtained at Step S50, as the display image, and the image display means 8 stereoscopically displays at Step S70 the images generated as described above.

This makes it possible to obtain effects similar to those of the first embodiment.

Modified Example 5 of First Embodiment

While the data analysis means 6 performs the nonparametric regression analysis by using the linear regression equation of Equation (24) at Step S50 in the first embodiment, ICA (Independent Component Analysis) can also be used as the data analysis technique (Non-patent Document 12: "Detailed explanation of Independent Component Analysis Novel world of signal analysis", Aapo Hyvarinen et al., Tokyo Denki University Press 2005).

In the present modified embodiment, the data evaluation value constitution means 5 constitute at Step S40 an evaluation value based on the connection degree vector $\vec{C}$(l,m,k) calculated by the inter-voxel connection degree calculation means 4.

Conditions of "spatial independence" in the analysis of the time series data ρ(l, m, k, i) of the brain function information according to the independent component analysis is changed to "spatial independence in consideration of the connection degree based on the diffusion tensor information" in the present modified embodiment. There are several specific techniques of the independent component analysis, but in the case of, for example, a technique to minimize a cross-correlation, the cross-correlation is not minimized, but is moved closer to the evaluation value based on the connection degree, in the present modified embodiment. As a result of this, the cross-correlation between the voxels with a large connection degree becomes a "degree of independence" which is close to the evaluation value based on the connection degree, while the cross-correlation is minimized between the voxels with a small connection degree (or there is no connection degree). More specifically, for example, a weighting coefficient according to the evaluation value based on the connection degree is set to each term of the square sum in the evaluation function which minimizes the square sum of the non-diagonal elements of the correlation matrix. This weighting coefficient is constituted so that the larger the connection degree becomes, the smaller it becomes.

Next, the data analysis means 6 performs the independent component analysis at Step S50 in consideration of the evaluation value constituted as described above. In that case, the optimal κ is determined using the Cross Validation method, and the data analysis is performed by the probabilistic search algorithm, such as GA.

Next, the image generation means 7 generates at Step S60 independent components obtained as described above as the display image. However, since there are many independent components obtained as the results of the above-described analysis, processing of extracting only a row vector having the highest correlation with the task/rest among all the row vectors is performed.

Thereafter, at Step S70, the image display means 8 stereoscopically displays the images generated as described above.

This makes it possible to obtain effects similar to those of the first embodiment.

Note that while there are a principal component analysis, a factor analysis, a quantification III, and the like, as a technique of extracting predetermined main components from the time series data of the brain function information other than the above independent component analysis, these analysis techniques can fundamentally perform the analysis in a manner similar to that described above as well.

Second Embodiment

Figure 10:
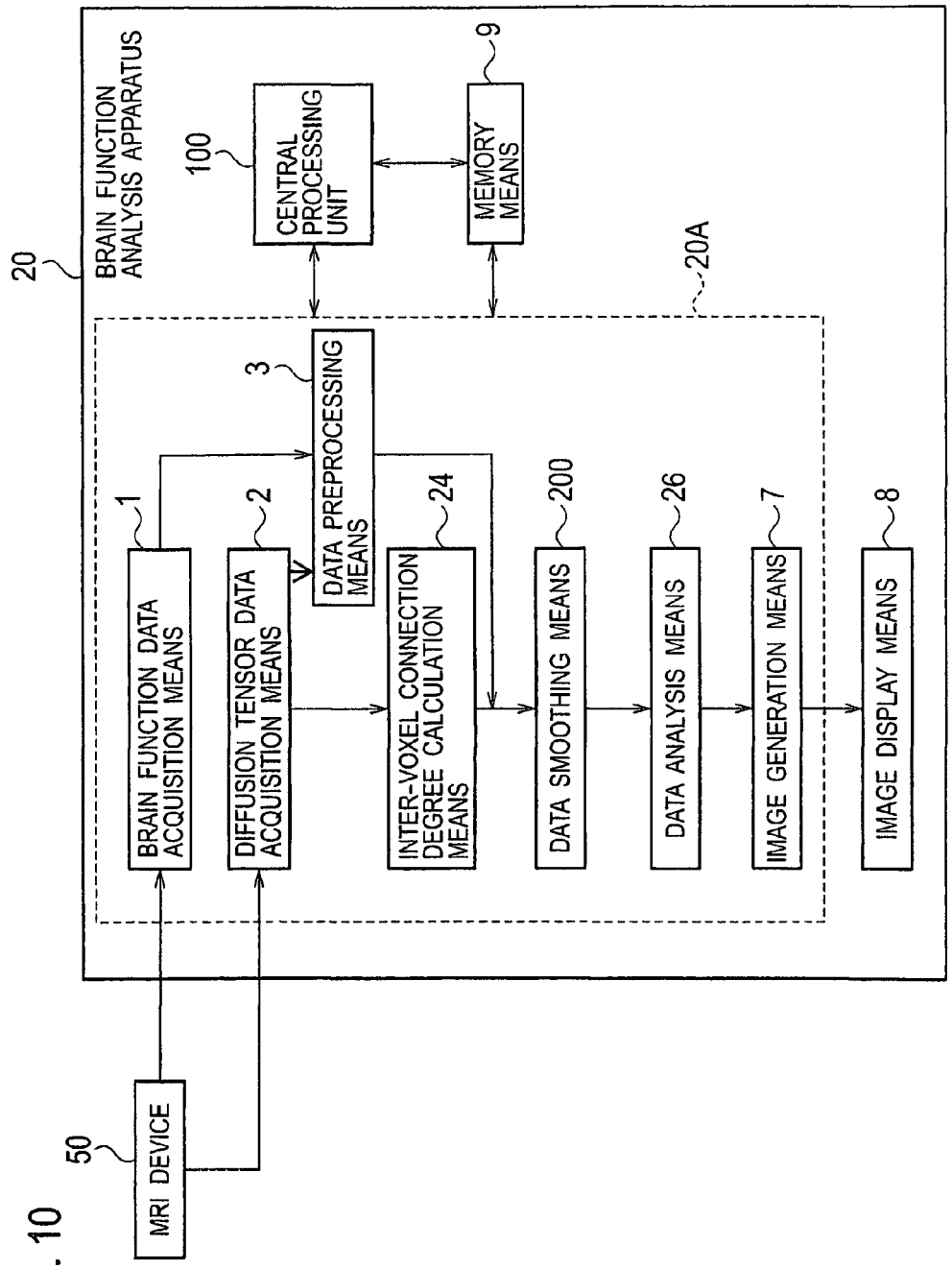
FIG. 10 is a block diagram showing a schematic configuration of a brain function analysis apparatus in accordance with a second embodiment of the present invention.

FIG. 10 is a block diagram showing a schematic configuration of a brain function analysis apparatus in accordance with a second embodiment of the present invention. A brain function analysis apparatus 20 of the second embodiment has a configuration provided with inter-voxel connection degree calculation means 24 instead of the inter-voxel connection degree calculation means 4, the data evaluation value constitution means 5, and the data analysis means 6 in the brain function analysis apparatus 10 of the first embodiment, data evaluation value constitution means 25, data smoothing means 200, and data analysis means 26. The same symbol is given to the same configuration as that of the first embodiment, and repeated descriptions thereof will be omitted hereinafter. Note that although the brain function analysis apparatus 20 employs a display console type in which major constitution means 20A of the present embodiment, the image display means 8, and the memory means 9 are integrated in the present embodiment, there may be employed such a configuration that the image display means 8, or the image display means 8 and the memory means 9 are separated from the major constitution means 20A as respectively independent image display unit and storage unit.

After calculating the averaged diffusion degree vector $\vec{D}'(l,m,k)$ (Equation (12)) from the diffusion tensor data D(l, m, k) (Equation (9)) acquired by the diffusion tensor data acquisition means 2 in a manner described in detail in the first embodiment, the inter-voxel connection degree calculation means 24 calculates the connection degree vector $\vec{W}(l,m,k)$ for determining smoothness between adjacent voxels upon smoothing the time series data ρ(l, m, k, i) of the brain function information which is pre-processed by the data preprocessing means 3 according to a size of each components $D'_l(l, m, k)$, $D'_m(l, m, k)$ and $D'_k(l, m, k)$ of the averaged diffusion degree vector $\vec{D}'(l,m,k)$.

The data smoothing means 200 constitutes a weighted average filter for smoothing the time series data ρ(l, m, k, i) of the brain function information which is pre-processed by the data preprocessing means 3, using the connection degree vector $\vec{W}(l,m,k)$ calculated by the inter-voxel connection degree calculation means 24, and smoothes the time series data ρ(l, m, k, i) of the brain function information which is pre-processed by the data preprocessing means 3 using the weighted average filter.

The data analysis means 26 performs data analysis on the data smoothed by the data smoothing means 200 using techniques, such as SPM or the like.

Figure 11:
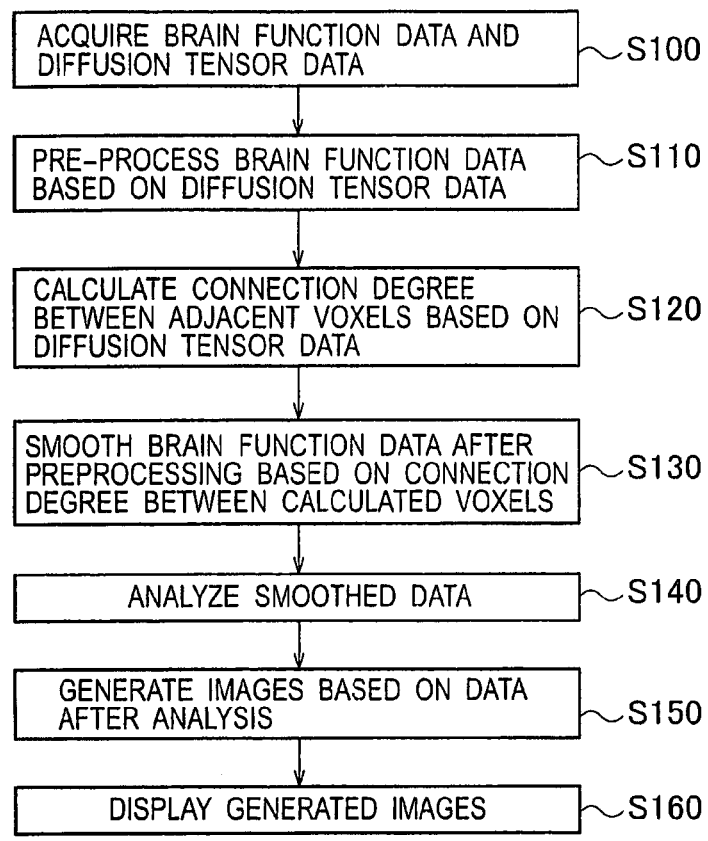
FIG. 11 is a flow chart showing one example of a data analysis procedure performed by the brain function analysis apparatus shown in FIG. 10.

FIG. 11 is a flow chart showing one example of a data analysis procedure performed by the brain function analysis apparatus 20 in accordance with the second embodiment shown in FIG. 10.

At Step S100, the brain function data acquisition means 1 acquires the original time series data ρ'(l, m, k, i) of the brain function information measured by the MRI device 50. At the same step, the diffusion tensor information acquisition means 2 acquires the diffusion tensor data D(l, m, k) measured also by the MRI device 50.

Next, at Step S110, the data preprocessing means 3 performs the preprocessing (a) to (d) explained in full detail in the first embodiment on the original time series data ρ'(l, m, k, i) of the brain function information acquired at Step S100 to thereby generate the time series data ρ(l, m, k, i) of the brain function information.

Next, at Step S120, the inter-voxel connection degree calculation means 24 first calculates the averaged diffusion degree vector $\vec{D}'(l,m,k)$ from the diffusion tensor data D(l, m, k) which is acquired at Step S100 in a manner explained in full detail in the first embodiment.

Subsequently, the connection degree vector $\vec{W}(l,m,k)$ for determining smoothness between adjacent voxels upon smoothing the time series data ρ(l, m, k, i) of the brain function information which is pre-processed by the data preprocessing means 3 according to the size of each components $D'_l(l, m, k)$, $D'_m(l, m, k)$ and $D'_k(l, m, k)$ of the averaged diffusion degree vector $\vec{D}'(l,m,k)$ is calculated as, for example, $$\vec{W}(l, m, k) = (w_l(l, m, k), w_m(l, m, k), w_k(l, m, k)) \equiv \qquad (31)$$

$$\left( \frac{wD'_l(l, m, k)}{\sum_{\alpha=l,m,k} D'_\alpha(l, m, k)}, \frac{wD'_m(l, m, k)}{\sum_{\alpha=l,m,k} D'_\alpha(l, m, k)}, \frac{wD'_k(l, m, k)}{\sum_{\alpha=l,m,k} D'_\alpha(l, m, k)} \right).$$

Next, at Step S130, the data smoothing means 26 anisotropically smoothes the time series data ρ(l, m, k, i) of the brain function information which is pre-processed at Step S110 using the connection degree vector $\vec{W}(l,m,k)$ calculated at Step S120, for example, as $$\bar{\rho}(l, m, k, i) = \qquad (32)$$

$$\frac{1}{w+W}[\{W\rho(l, m, k, i) + w_l \cdot \{\rho(l-1, m, k, i) + \rho(l+1, m, k, i)\} +$$

$$w_m \cdot \{\rho(l, m-1, k, i) + \rho(l, m+1, k, i)\} +$$

$$w_k \cdot \{\rho(l, m, k-1, i) + \rho(l, m, k+1, i)\}].$$

Here "w" and "W" are weight factors, and they are normalized so as to satisfy $$\left\{ \sum_{\alpha=l,m,k} D'_\alpha(l, m, k) \right\} + W = w + W = 1. \qquad (33)$$

Figure 12:
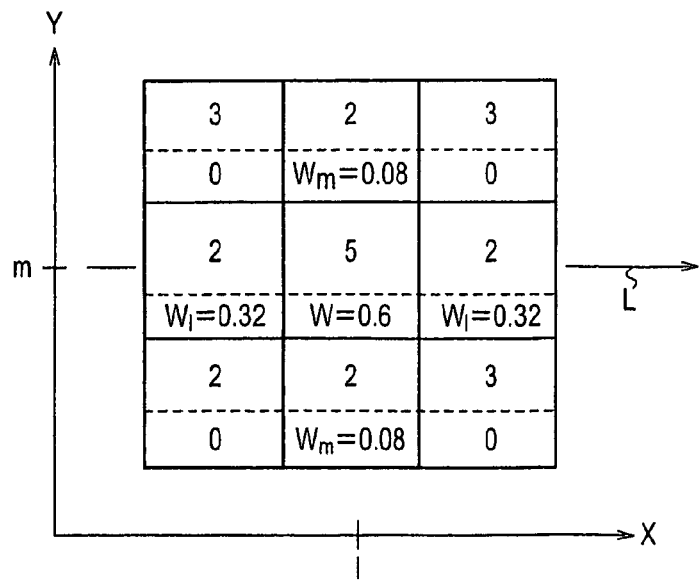
FIG. 12 is a view illustrating a smoothing technique performed by data smoothing means shown in FIG. 10.

FIG. 12 illustrates a data smoothing technique in accordance with the present embodiment, and shows the time series data $\rho_k(l, m, i)$ of the brain function information on nine voxels about a position (l, m) of a certain two-dimensional slice image $S_k$. In this example, $\rho_k(l, m, i)=5$, $\rho_k(l-1, m, i)=\rho_k(l-1, m-1, i)=\rho_k(l, m-1, i)=\rho_k(l, m+1, i)=\rho_k(l+1, m, i)=2$ and $\rho_k(l+1, m-1, i)=\rho_k(l-1, m+1, i)=\rho_k(l+1, m+1, i)=3$, where four of $\rho_k(l, m-1, i)$, $\rho_k(l, m+1, i)$, $\rho_k(l-1, m, i)$, $\rho_k(l+1, m, i)$ are used for smoothing $\rho_k(l, m, i)$, among them. Further, it is assumed a situation to satisfy $D'_k(l, m, k)=0$ (namely, there is no diffusion of the proton in the Z direction), $D'_l(l, m, k)=0.8$, $D'_m(l, m, k)=0.2$, w=0.4 and W=0.6. At this time, the connection degree vector $\vec{W}(l,m,k)$ results in $$\vec{W}(l,m,k)=(0.4\times0.8, 0.4\times0.2, 0)=(0.32, 0.08, 0) \qquad (34)$$

from Equation (31), so that it is seen that the time series data ρ(l, m, k, i)=5 of the brain function information on the voxel of the position (l, m, k) is smoothed as $$\bar{\rho}(l, m, k, i) = \frac{1}{1}(0.6\times5 + 0.32\times2\times2 + 0.08\times2\times2) = 4.44 \qquad (35)$$

from Equation (36).

This processing is performed on the time series data ρ(l, m, k, i) of the brain function information on all the voxels of the two-dimensional slice image $S_k$, so that it can smooth the data so that a contribution from a direction having the largest component (X direction in this example) among directions (namely, the components $D'_l(l, m, k)$, $D'_m(l, m, k)$ and $D'_k(l, m, k)$) of the averaged diffusion degree vector $\vec{D}'(l,m,k)$) along the running direction of the nerve fibers may become large.

Furthermore, as described in a part of Equation (5), it may be soothed only with two voxels which match with a direction of the eigenvector $\vec{v}_M(l,m,k)$ corresponding to the maximum eigenvalue $\lambda_M$ other than this.

Next, at Step S140, the data analysis means 26 performs data analysis on the time series data of the brain function information $\overline{\rho}(l,m,k,i)$ smoothed at Step S140 using analysis techniques, such as SPM or the like.

Next, at Step S150, the image generation means 7 generates color tone images, such as grayscale or full color images, with respect to the results analyzed by the data analysis means 26.

Thereafter, at Step S160, the image display means 8 stereoscopically displays the images generated as described above.

As described above, in the second embodiment, the time series data of the brain function information acquired from the MRI device has been subjected to the smoothing processing based on the connection degree vector calculated from the diffusion tensor data acquired also from the MRI device, so that activated brain regions can be located also in consideration of the connection structure between the activated brain regions.

Incidentally, the connection degree vector $\vec{W}(l,m,k)$ of Equation (31) or the algorithm of the smoothing processing of Equation (32) is just one example, and the other embodiments are also possible.

Further, it is clear from the above description that the technique of the data smoothing processing in the present embodiment is not dependent on a specific data analysis technique.

Modified Example of Second Embodiment

Although the data analysis is performed using the analysis techniques, such as SPM or the like at Step S140 after performing the smoothing processing on the time series data $\rho(l, m, k, i)$ of the brain function information using the connection degree vector $\vec{W}(l,m,k)$ calculated from the diffusion tensor data $D(l, m, k)$ at Step S130 in the second embodiment, a technique of reversing these steps is also considered in achieving the object of the present invention.

Accordingly, a modified example of the above second embodiment will be then described. Incidentally, only portions different from those of the second embodiment will be hereinafter described in order to avoid duplication.

Figure 13:
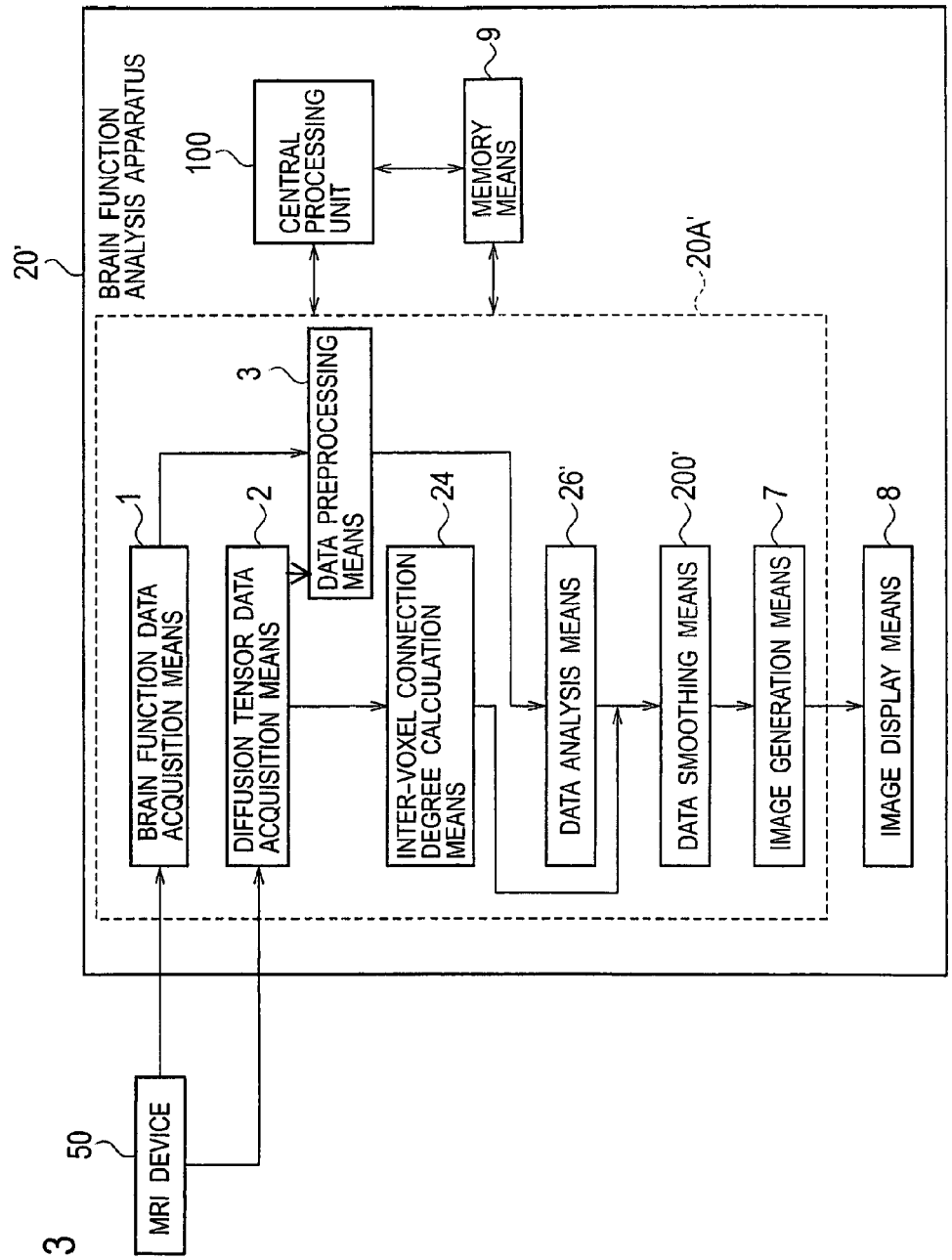
FIG. 13 is a block diagram showing a schematic configuration of a brain function analysis apparatus in accordance with a modified example of the second embodiment.

FIG. 13 is a block diagram showing a schematic configuration of a brain function analysis apparatus in accordance with the modified example of the second embodiment. Although a configuration of a brain function analysis apparatus 20' in accordance with the present modified embodiment is fundamentally the same as that of the second embodiment, it differs in that the data smoothing means 200 and the data analysis means 26 are exchanged. Thus, the data analysis procedure performed by the brain function analysis apparatus 20' differs from that of the second embodiment. Note that although the brain function analysis apparatus 20' employs a display console type in which major constitution means 20A' of the present embodiment, the image display means 8, and the memory means 9 are integrated in the present embodiment, there may be employed such a configuration that the image display means 8, or the image display means 8 and the memory means 9 are separated from the major constitution means 20A' as respectively independent image display unit and storage unit.

Figure 14:
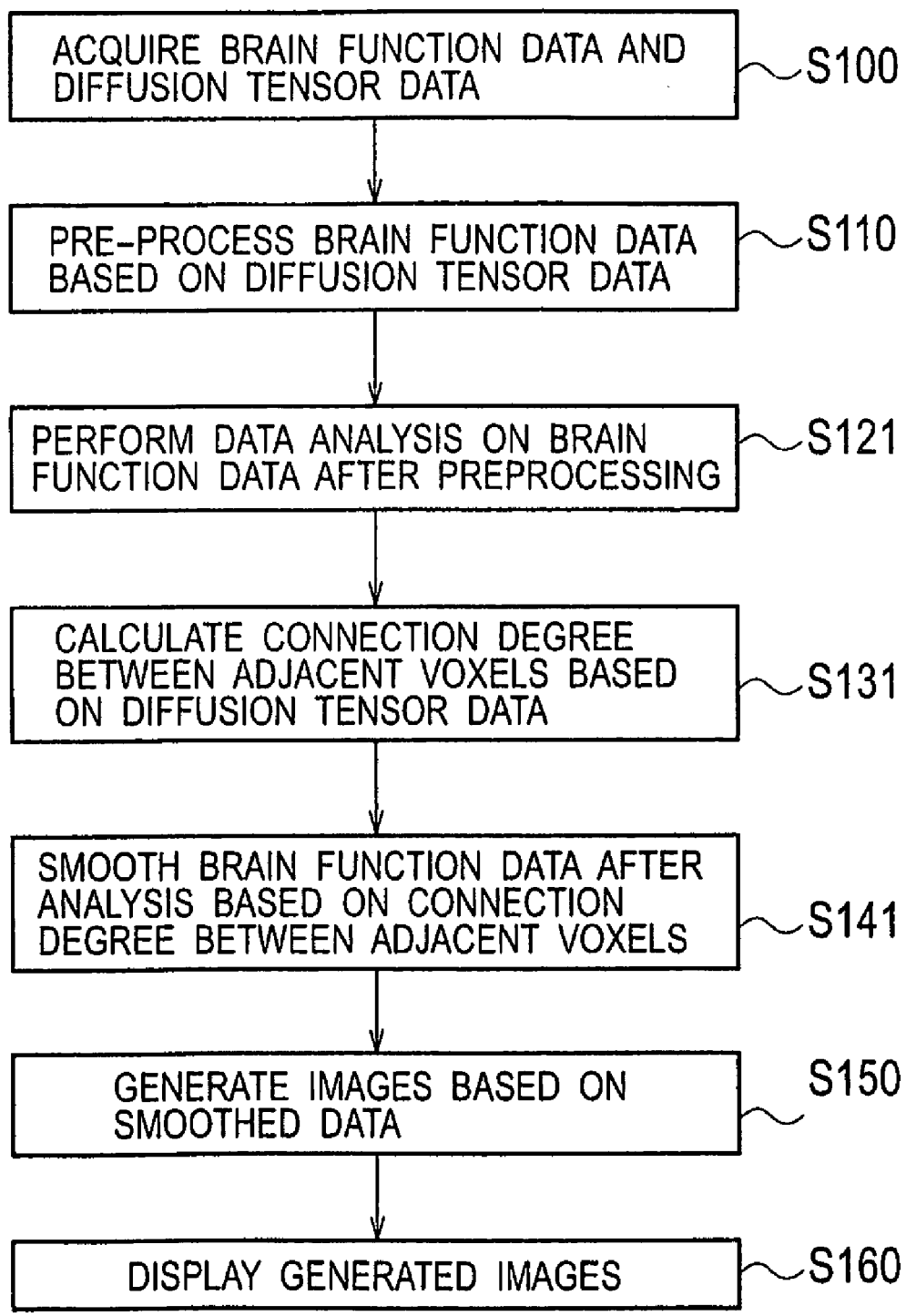
FIG. 14 is a flow chart showing one example of a data analysis procedure performed by the brain function analysis apparatus shown in FIG. 13.

FIG. 14 is a flow chart showing one example of a data analysis procedure performed by the brain function analysis apparatus 20' shown in FIG. 13. In the present modified embodiment, data analysis means 26' first performs at Step S121 a data analysis on the time series data $\rho(l, in, k, i)$ of the brain function information pre-processed by the data preprocessing means 3 using the analysis techniques, such as SPM or the like. Next, at Step S131, the inter-voxel connection degree calculation means 24 calculates a connection degree vector $\vec{W}(l,m,k)$ as shown by Equation (31) in a manner similar to that of the second embodiment.

Subsequently, at Step S141, data smoothing means 200' performs the smoothing processing on the brain function data $\rho(l, m, k)$ which is the result of being analyzed by the data analysis means 26' using Equation (32) in a manner similar to that of the second embodiment. Next, at Step S150, the image generation means 7 generates color tone images, such as grayscale or full color images according to a predetermined processing rule with respect to the data $\overline{\rho}(l,m,k)$ after the smoothing processing obtained as described above.

Thereafter, at Step S160, the image display means 8 stereoscopically displays the images generated as described above.

Thus, effects similar to those of the second embodiment are obtained also in the present modified embodiment.

Third Embodiment

Figure 15:
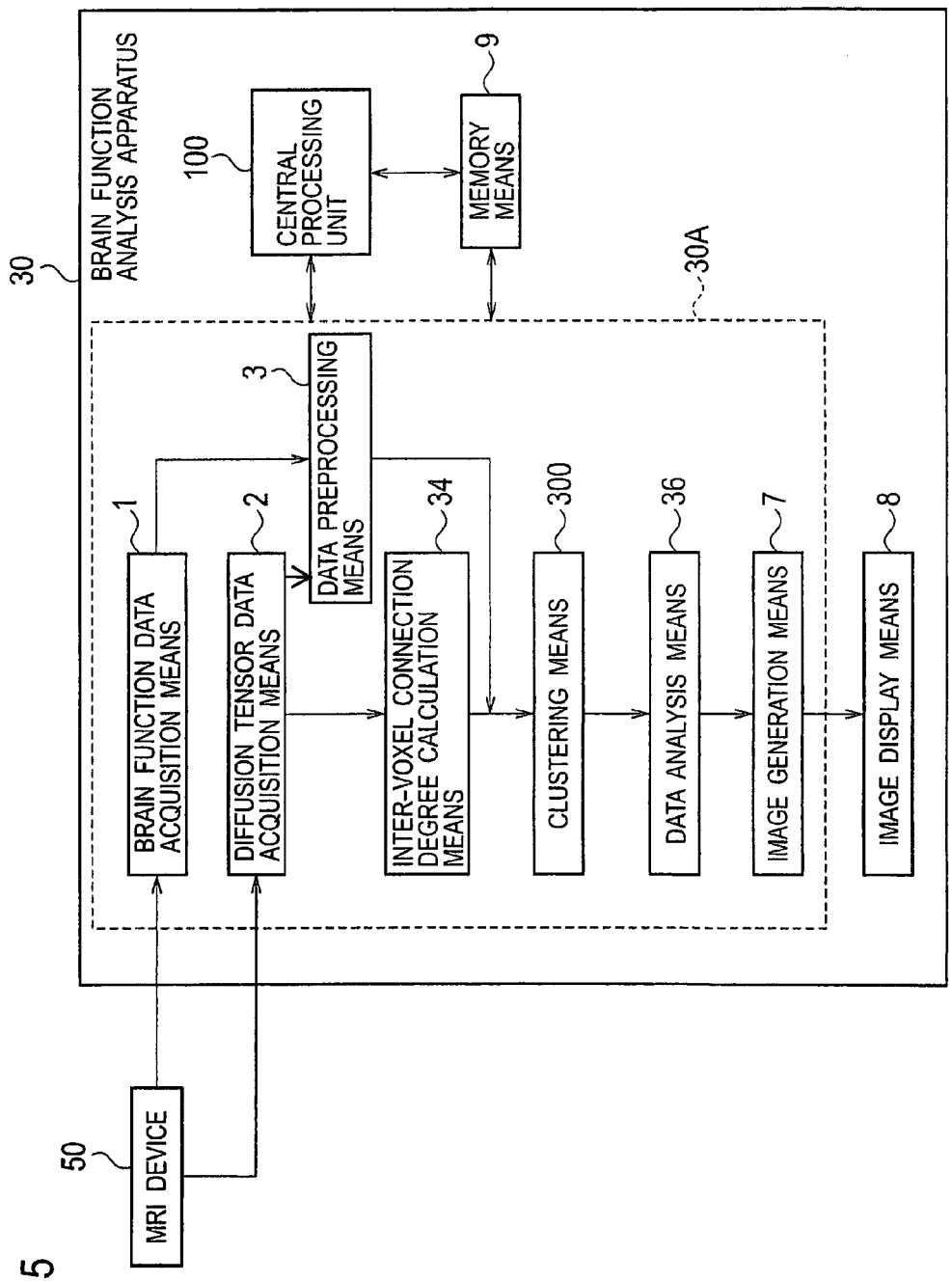
FIG. 15 is a block diagram showing a schematic configuration of a brain function analysis apparatus in accordance with a third embodiment of the present invention.

FIG. 15 is a block diagram showing a schematic configuration of a brain function analysis apparatus in accordance with a third embodiment of the present invention. A brain function analysis apparatus 30 of the third embodiment has a configuration provided with inter-voxel connection degree calculation means 34 instead of the inter-voxel connection degree calculation means 4, the data evaluation value constitution means 5, and the data analysis means 6 in the brain function analysis apparatus 10 of the first embodiment, the clustering means 300, and data analysis means 36. The same symbol is given to the same configuration as that of the first embodiment, and repeated descriptions thereof will be omitted hereinafter. Note that although the brain function analysis apparatus 30 employs a display console type in which major constitution means 30A of the present embodiment, the image display means 8, and the memory means 9 are integrated in the present embodiment, there may be employed such a configuration that the image display means 8, or the image display means 8 and the memory means 9 are separated from the major constitution means 30A as respectively independent image display unit and storage unit.

After calculating the averaged diffusion degree vector $\vec{D}'(l,m,k)$ (Equation (12)) from the diffusion tensor data $D(l, m, k)$ (Equation (9)) acquired by the diffusion tensor data acquisition means 2 in a manner described in detail in the first embodiment, the inter-voxel connection degree calculation means 34 calculates a connection degree vector $\vec{S}(l,m,k)$ as an index for clustering the voxels according to the size of each components $D'_l(l, m, k)$, $D'_m(l, m, k)$, and $D'_k(l, m, k)$ of the averaged diffusion degree vector $\vec{D}'(l,m,k)$.

The clustering means 300 clusters the voxels using the connection degree vector $\vec{S}(l,m,k)$ calculated by the inter-voxel connection degree calculation means 34.

The data analysis means 36 performs data analysis on the time series data ρ(l, m, k, i) of the brain function information pre-processed by the data preprocessing means 3 using the analysis techniques, such as SPM or the like, while using the voxel group (cluster) clustered by the clustering means 300 as a unit.

Figure 16:
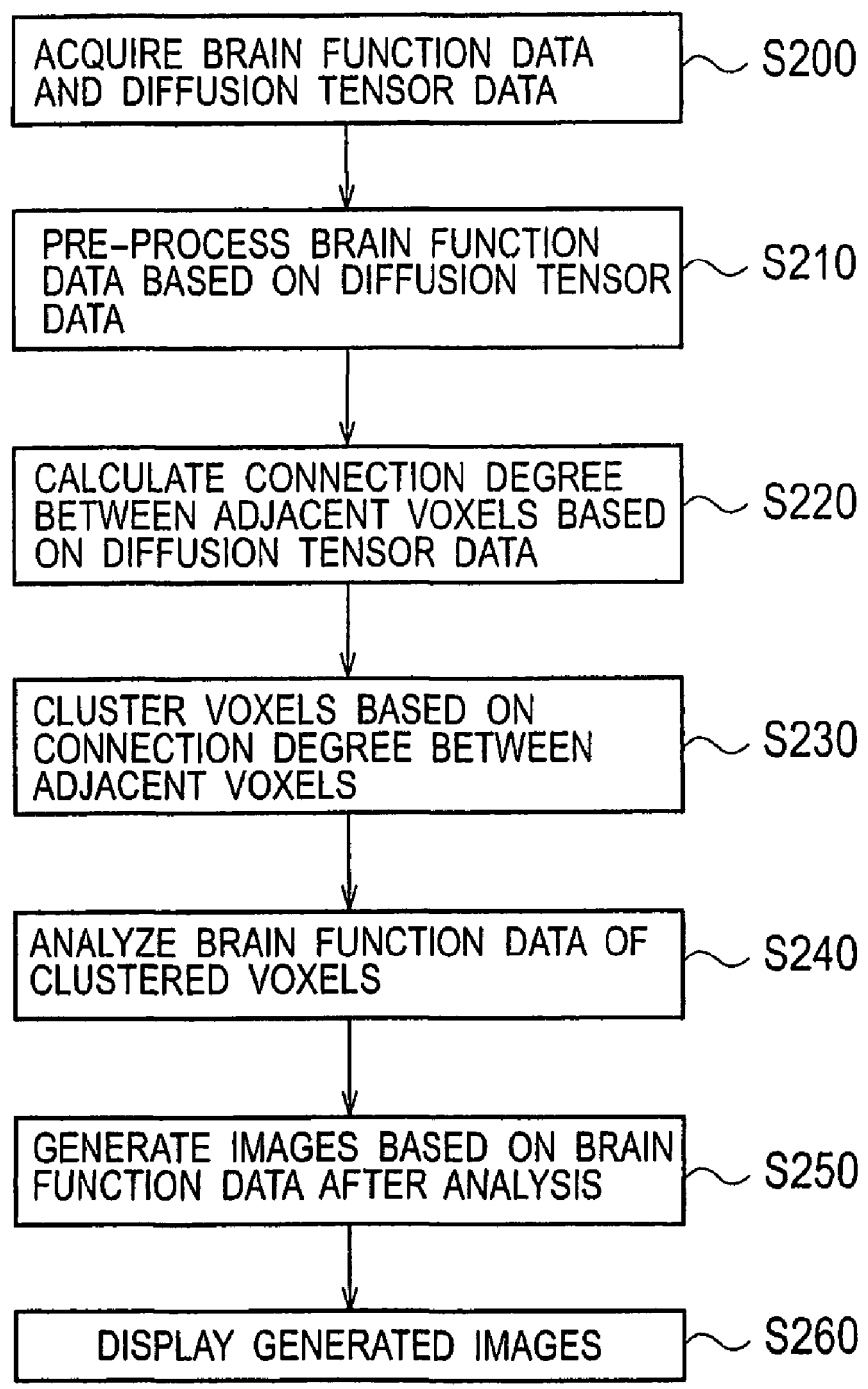
FIG. 16 is a flow chart showing one example of a data analysis procedure performed by the brain function analysis apparatus shown in FIG. 15.

FIG. 16 is a flow chart showing one example of a data analysis procedure performed by the brain function analysis apparatus 30 in accordance with the third embodiment shown in FIG. 15.

At Step S200, the brain function data acquisition means 1 acquires the original time series data ρ'(l, m, k, i) of the brain function information measured by the MRI device 50. At the same step, the diffusion tensor information acquisition means 2 acquires the diffusion tensor data D(l, m, k) measured also by the MRI device 50.

Next, at Step S210, the data preprocessing means 3 performs the preprocessing (a) to (d) explained in full detail in the first embodiment on the original time series data ρ'(l, m, k, i) of the brain function information acquired at Step S200 to thereby generate the time series data ρ(l, m, k, i) of the brain function information.

Next, at Step S220, the inter-voxel connection degree means calculation means 34 first calculates the averaged diffusion degree vector $\vec{D}'(l,m,k)$ from the diffusion tensor data D(l, m, k) which is acquired at Step S200 in a manner explained in full detail in the first embodiment.

Subsequently, it calculates a connection degree vector $\vec{S}(l,m,k)$ which is an index for clustering the voxels according to the size of each components $D'_l(l, m, k)$, $D'_m(l, m, k)$, and $D'_k(l, m, k)$ of the averaged diffusion degree vector $\vec{D}'(l,m,k)$ as, for example, $$\vec{S}(l,m,k)=(S_l(l,m,k),S_m(l,m,k),S_k(l,m,k))=\vec{D}'(l,m,k)-\vec{h}(l,m,k) \quad (36)$$

where $\vec{h}$ is a constant vector, representing a threshold of the clustering, written as $$\vec{h}(l,m,k)=(h_x,h_y,h_z). \quad (37)$$

Next, at Step S230, the clustering means 300 clusters voxels in which values of each components $S_l(l, m, k)$, $S_m(l, m, k)$, and $S_k(l, m, k)$ of the connection degree vector $\vec{S}(l,m,k)$ calculated at Step S220 become positive in the X direction, the Y direction and the Z direction, respectively.

Figure 17:
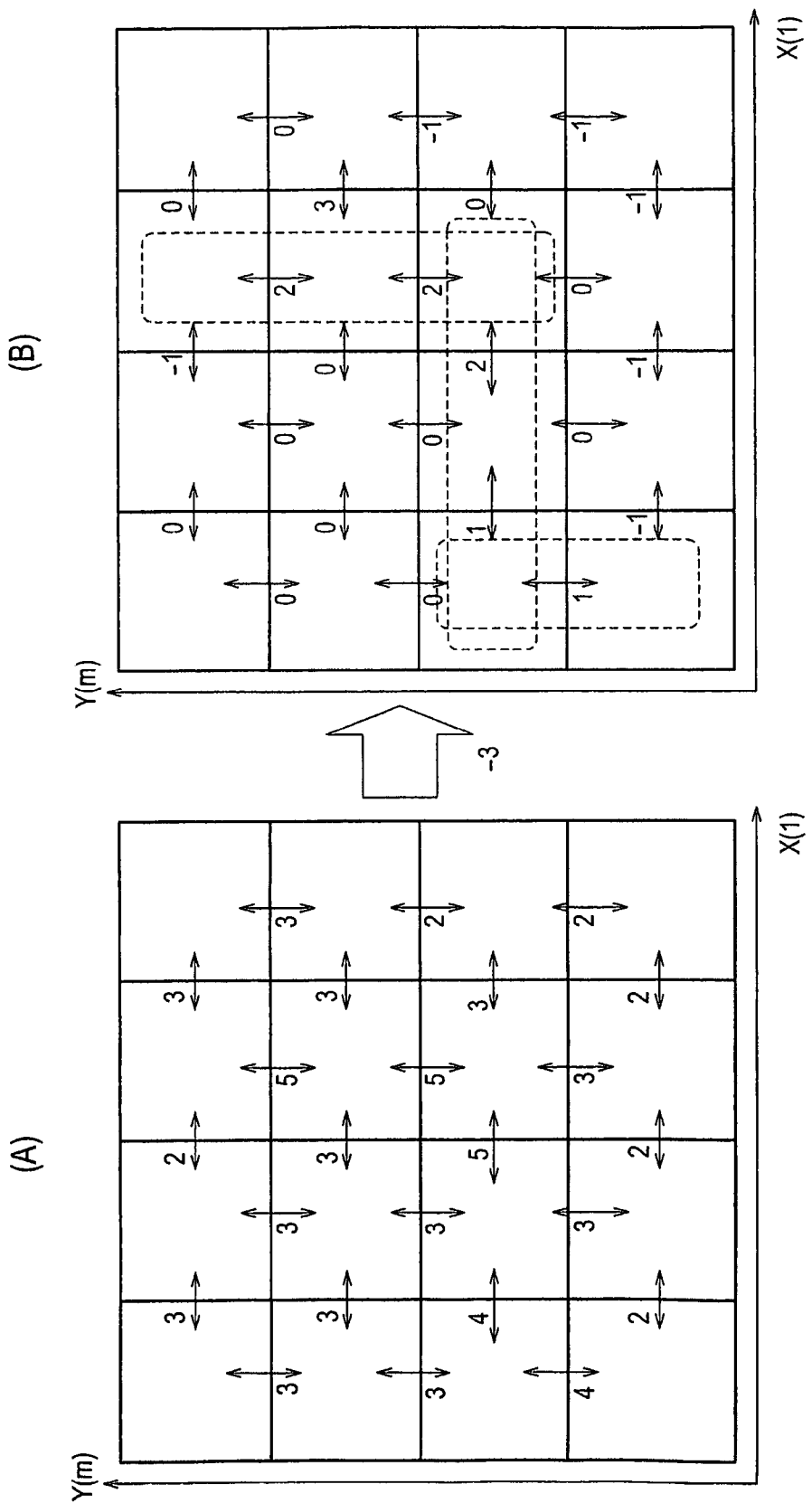

FIG. 17 is a view illustrating a clustering technique performed by the clustering means 300 shown in FIG. 15, and shows 16 voxels of a certain two-dimensional slice image $S_k$. Values of arrows between adjacent voxels in FIG. 17(A) represent values of the average degree of diffusion vector in the X direction or the Y direction. If the values of each components of the constant vector $\vec{h}$ of Equation (37) are set to $h_l=h_m=3$ and $h_k=0$, respectively, each values of the components $S_l(l, m, k)$ and $S_m(l, m, k)$ of the connection degree vector $\vec{S}(l,m,k)$ become as shown in FIG. 17(B).

At this time, by sequentially connecting adjacent voxels in which the components $S_l(l, m, k)$ and $S_m(l, m, k)$ of the connection degree vector $\vec{S}(l,m,k)$ are both positive in each directions of the X direction and the Y direction, voxels enclosed with dotted lines will be eventually formed as one cluster.

Since the connection degree vector $\vec{S}(l,m,k)$ becomes a function of the average degree of diffusion vector D'(l, m, k), such clustering shall reflect the running direction of the nerve fiber.

Next, at Step S240, the data analysis means 36 performs data analysis on the time series data ρ(l, m, k, i) of the brain function information pre-processed at Step S210 using analysis methods, such as SPM or the like, for every voxel group (cluster) clustered at Step S230. In that case, for example, processing of averaging the time series data of the brain function information within one cluster or the like is required.

Next, at Step S250, the image generation means 7 generates color tone images, such as grayscale or full color images according to a predetermined processing rule with respect to the data ρ(l,m,k) after the date analysis performed at Step S240.

Thereafter, at Step S260, the image display means 8 stereoscopically displays the images generated at Step 250.

As described above, in the third embodiment, the time series data of the brain function information acquired also from the MRI device has been analyzed for every cluster after clustering the voxels based on the diffusion tensor data acquired from the MRI device, so that activated brain regions can be located also in consideration of the connection structure between the activated brain regions.

Incidentally, the connection degree vector $\vec{S}(l,m,k)$ of Equation (36) is just one example, and the other embodiments are also possible.

Additionally, it may be clustered only with two voxels which match with the direction of the eigenvector $\vec{v}_M(l,m,k)$ corresponding to the maximum eigenvalue $\lambda_M$, as described in a part of Equation (5).

Further, it is clear from the above description that the technique of the clustering processing in the present embodiment is not dependent on a specific data analysis technique.

Modified Example 1 of Third Embodiment

Although the data analysis is performed on the time series data ρ(l, in, k, i) of the brain function information for every cluster using the analysis techniques, such as SPM or the like at Step S240 after clustering the voxels using the connection degree vector $\vec{S}(l,m,k)$ calculated from the diffusion tensor data D(l, m, k) at Step S230 in the third embodiment, a technique of reversing these steps is also considered in achieving the object of the present invention.

Accordingly, a modified example of the above third embodiment will be then described. Incidentally, only portions different from those of the third embodiment will be hereinafter described in order to avoid duplication.

Figure 18:
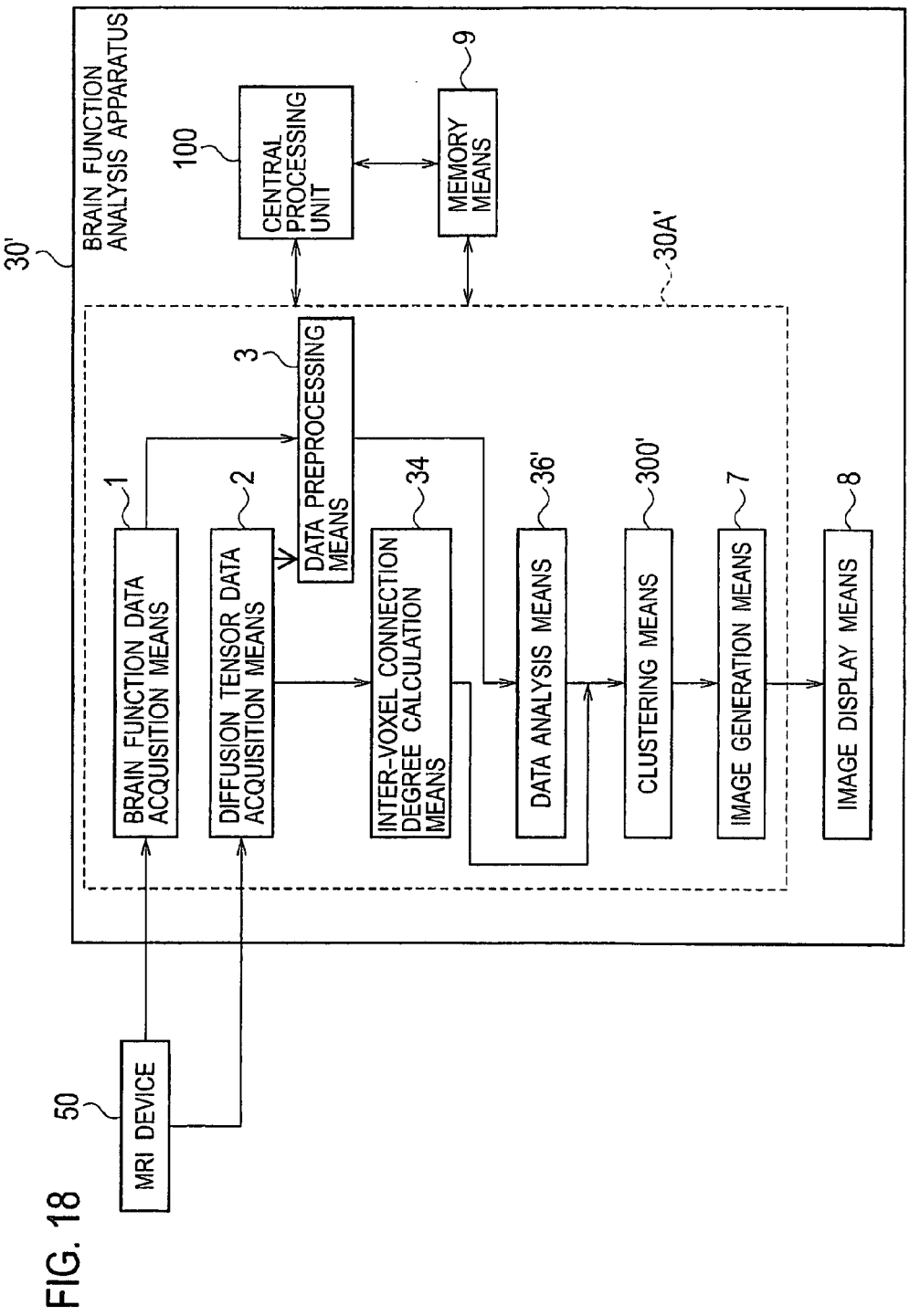
FIG. 18 is a block diagram showing a schematic configuration of a brain function analysis apparatus in accordance with a modified example of the third embodiment.

FIG. 18 is a block diagram showing a schematic configuration of a brain function analysis apparatus in accordance with the modified example of the third embodiment. Although a configuration of a brain function analysis apparatus 30' in accordance with the present modified embodiment is the same as that of the third embodiment basically, it differs in that the clustering means 300 and the data analysis means 36 are exchanged. Thus, the data analysis procedure performed by the brain function analysis apparatus 30' differs from that of the third embodiment. Incidentally, although the brain function analysis apparatus 30' employs a display console type in which major constitution means 30A' of the present embodiment, the image display means 8, and the memory means 9 are integrated in the present embodiment, there may be employed such a configuration that the image display means 8, or the image display means 8 and the memory means 9 are separated from the major constitution means 30A' as respectively independent image display unit and storage unit.

Figure 19:
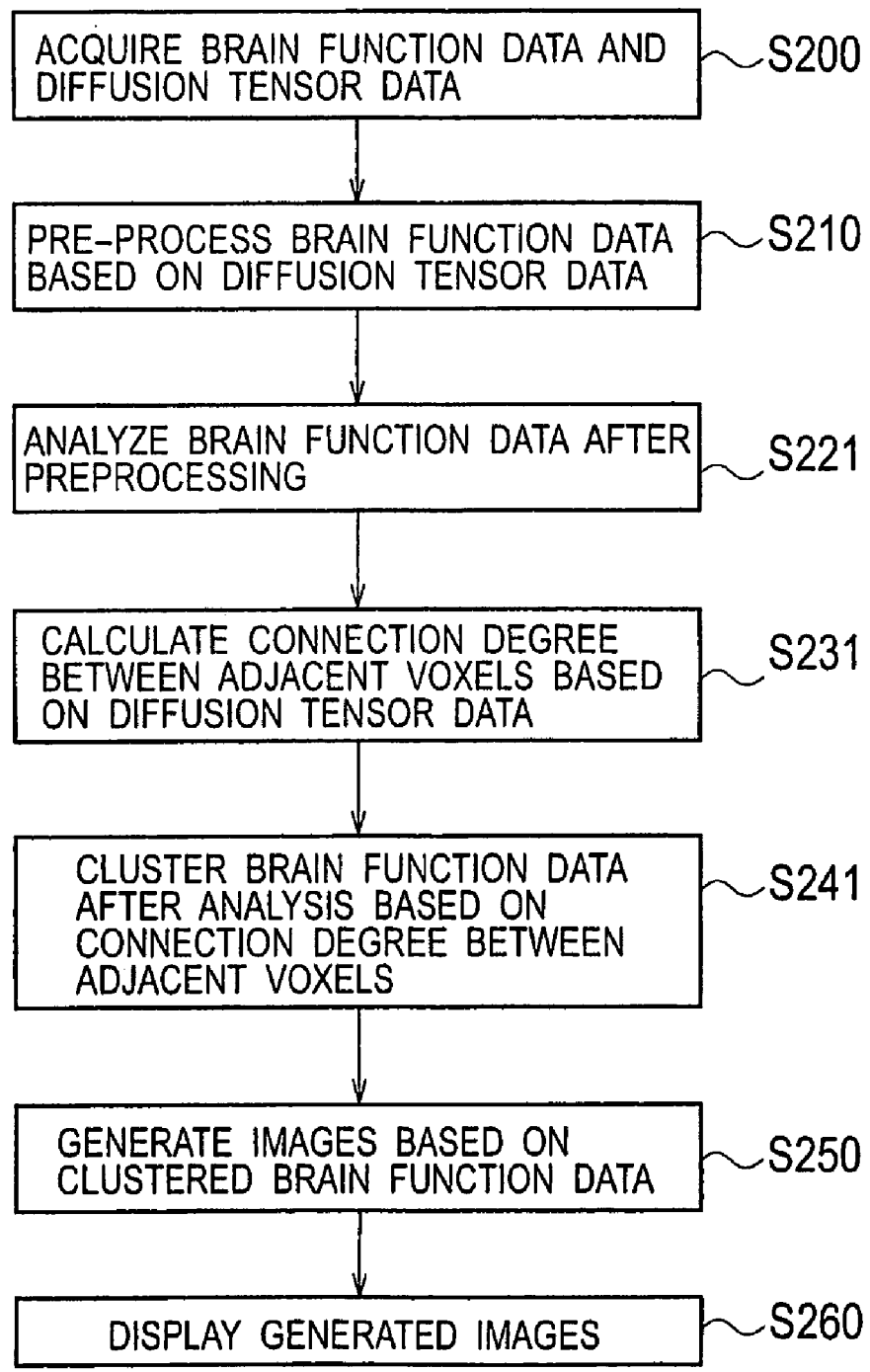
FIG. 19 is a flow chart showing one example of a data analysis procedure performed by the brain function analysis apparatus shown in FIG. 18.

FIG. 19 is a flow chart showing one example of a data analysis procedure performed by the brain function analysis apparatus 30' shown in FIG. 18. In the present modified embodiment, at Step S221, data analysis means 36' first performs a data analysis on the time series data $\rho(l, m, k, i)$ of the brain function information pre-processed by the data preprocessing means 3 using the analysis techniques, such as SPM or the like. Next, at Step S231, the inter-voxel connection degree calculation means 34 calculates a connection degree vector $\vec{S}(l,m,k)$ as shown by Equation (36) in a manner similar to that of the third embodiment.

Next, at Step S241, clustering means 300' clusters voxels as shown in FIG. 17 with respect to the brain function data $\rho(l, m, k)$ analyzed by the data analysis means 36' in a manner similar to that of the third embodiment. Next, at Step S250, the image generation means 7 generates color tone images, such as grayscale or full color images according to a predetermined processing rule with respect to the brain function data $\tilde{\rho}(l,m,k)$ clustered as described above.

Thereafter, at Step S260, the image display means 8 stereoscopically displays the images generated as described above.

Thus, effects similar to those of the third embodiment are obtained also in the present modified embodiment.

Modified Example 2 of Third Embodiment

After performing a data analysis on the time series data $\rho(l, m, k, i)$ of the brain function information pre-processed by the data preprocessing means 3 using the analysis techniques, such as SPM or the like, the brain function data $\rho(l, m, k)$ after the data analysis is clustered using the connection degree vector $\vec{S}(l,m,k)$ calculated by the inter-voxel connection degree calculation means 34 in the modified example 1 of the third embodiment, but it is also considered to use a classificational analysis technique as the data analysis technique.

Accordingly, a case where a decision tree which is one of the classificational analysis techniques is used as the data analysis technique will be described as one example in the present modified embodiment. For example, when the decision tree technique is used while using the explaining variable (attribute) as the time series data $\rho(l, m, k)$ of the brain function information, and the external criterion (task) as the time series data of the task and the rest as shown in FIG. 4, unnecessary attributes (voxels) are removed and only required attributes (voxels) remain. Thus, the voxels remained without being removed are clustered using the connection degree vector $\vec{S}(l,m,k)$.

For example, (1) a certain voxel is chosen, (2) voxels with connection degree not less than a constant value around the voxel are clustered, (3) the processing (2) is continued until there is no voxel with connection degree not less than the constant value around it, and (4) if there are still any voxels remained, a certain voxel is chosen and the process will be returned to the processing (2).

Next, at Step S250, the image generation means 7 generates color tone images, such as grayscale or full color images according to a predetermined processing rule with respect to the brain function data $\tilde{\rho}(l,m,k)$ clustered as described above.

Thereafter, at Step S260, the image display means 8 stereoscopically displays the images generated as described above.

Thus, effects similar to those of the third embodiment are obtained also in the present modified embodiment.

Fourth Embodiment

Figure 20:
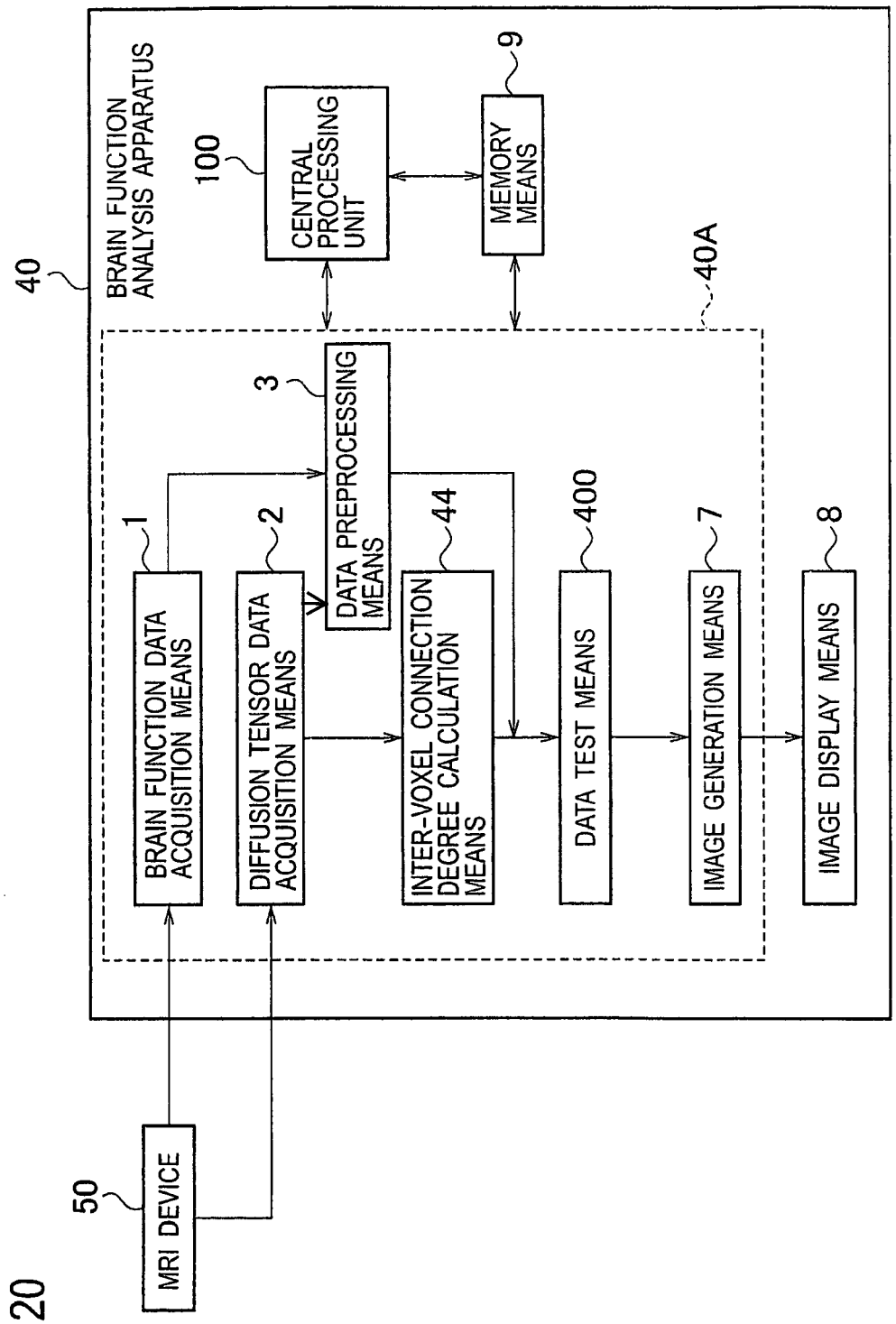
FIG. 20 is a block diagram showing a schematic configuration of a brain function analysis apparatus in accordance with a fourth embodiment of the present invention.

FIG. 20 is a block diagram showing a schematic configuration of a brain function analysis apparatus in accordance with a fourth embodiment. A brain function analysis apparatus 40 of the fourth embodiment has a configuration provided with inter-voxel connection degree calculation means 44 instead of the inter-voxel connection degree calculation means 4, the data evaluation value constitution means 5, and the data analysis means 6 in the brain function analysis apparatus 10 of the first embodiment, and data test means 400. The same symbol is given to the same configuration as that of the first embodiment, and repeated descriptions thereof will be omitted hereinafter. Incidentally, although the brain function analysis apparatus 40 employs a display console type in which major constitution means 40A of the present embodiment, the image display means 8, and the memory means 9 are integrated in the present embodiment, there may be employed such a configuration that the image display means 8, or the image display means 8 and the memory means 9 are separated from the major constitution means 40A as respectively independent image display unit and storage unit.

The inter-voxel connection degree calculation means 44 calculates a connection degree vector $\vec{T}(l,m,k)$ for adjusting a reference value (test value, significance level, or the like) upon performing various data tests (for example, t-test, f-test, or z-test) for every voxel on the time series data $\rho(l, m, k, i)$ of the brain function information which is pre-processed by the data preprocessing means 3 as a function of the averaged diffusion degree vector $\vec{D}'(l,m,k)$ of Equation (12) from the diffusion tensor data $D(l, m, k)$ (Equation (9)) acquired by the diffusion tensor data acquisition means 2.

The data test means 400 corrects the reference value based on the connection degree vector $\vec{T}(l,m,k)$ calculated by the inter-voxel connection degree calculation means 44, and performs the data test for every voxel on the brain function data $\rho(l, m, k)$ after the preprocessing based on the corrected reference value.

Figure 21:
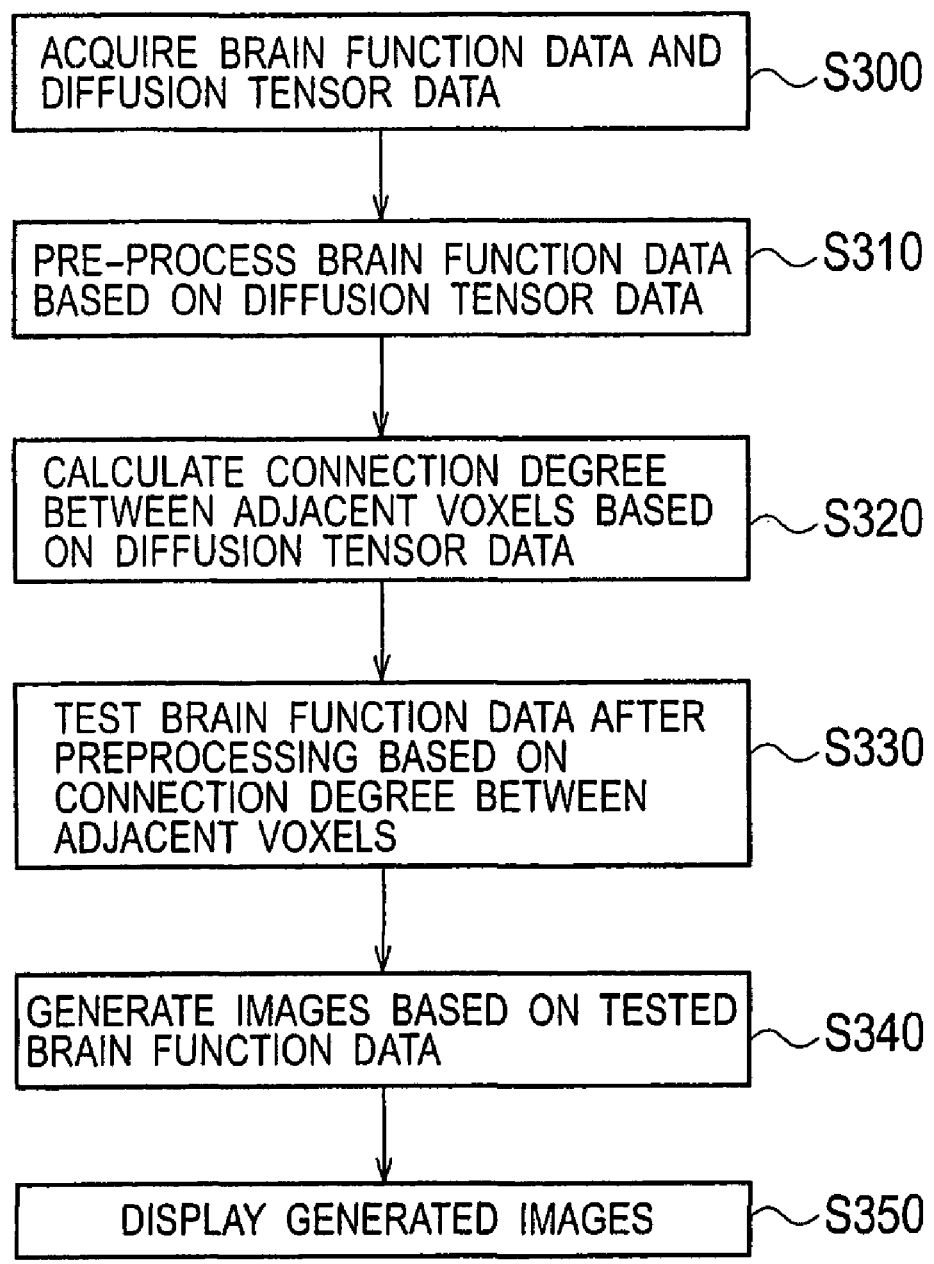
FIG. 21 is a flow chart showing one example of a data analysis procedure performed by the brain function analysis apparatus shown in FIG. 20.

FIG. 21 is a flow chart showing one example of a data analysis procedure performed by the brain function analysis apparatus 40 shown in FIG. 20.

At Step S300, the brain function data acquisition means 1 acquires the original time series data $\rho'(l, m, k, i)$ of the brain function information measured by the MRI device 50. At the same step, the diffusion tensor information acquisition means 2 acquires the diffusion tensor data $D(l, m, k)$ measured also by the MRI device 50.

Next, at Step S310, the data preprocessing means 3 performs the preprocessing (a) to (d) as explained in full detail in the first embodiment on the original time series data $\rho'(l, m, k, i)$ of the brain function information acquired at Step S300 to thereby generate the time series data $\rho(l, m, k, i)$ of the brain function information.

Next, at Step S320, the inter-voxel connection degree calculation means 44 calculates a connection degree vector:

$$\vec{T}(l,m,k)=(T_l(l,m,k),T_m(l,m,k),T_k(l,m,k)) \quad (38)$$

for adjusting the reference value (test value, significance level, or the like) upon performing, for example, the z-test, for every voxel, on the time series data $\rho(l, m, k, i)$ of the brain function information pre-processed at Step S310 as a function of the averaged diffusion degree vector $\vec{D}'(l,m,k)$ of Equation (12), from the diffusion tensor data D(l, m, k) acquired at Step S310.

Next, at Step S330, the data test means 400 performs, for every voxel, the z-test on the time series data ρ(l, m, k, i) of the brain function information pre-processed at Step S310 to thereby calculate a z score. Subsequently, at the same step, using a voxel with high calculated z score (for example, voxel (l, m, k)) as a reference point, a value a(l+1, m, k) of a significance level in a voxel (for example, voxel(l+1, m, k)) of a periphery (26 directions) of the reference point is lowered as, for example, $$a'(l+1,m,k)=\{1-\alpha T_f(l,m,k)\}a(l+1,m,k) \quad (39)$$

where α is a weighting coefficient, depending on to the connection degree vector $\vec{T}(l,m,k)$ calculated at Step S320.

Next, at Step S340, the image generation means 7 generates a value based on the brain function data ρ(l, m, k) on the voxel determined to be significant as the image data based on the significance level corrected at Step S330.

Subsequently, at Step S350, the image display means 8 stereoscopically displays the image data generated at Step S340.

Note that although the value of the significance level of the test is adjusted using the connection degree vector $\vec{T}(l,m,k)$ of Equation (38) calculated from the diffusion tensor data D(l, m, k) acquired by the diffusion tensor data acquisition means 2 in the above, the test value may be adjusted instead of that.

For example, a case where the z-test is performed between a task image and a rest image for every voxel is considered. The task image means an image when performing a certain task (for example, slice images of 1 to 3 represented with the thick line in FIG. 2), while the rest image means an image when not performing the task (for example, slice images of 5 to 7 represented with the thick line in FIG. 2). In this case, the z score (test value of the z-test) in the voxel (l, m, k) is typically represented as $$z(l, m, k) = \frac{|Mt(l, m, k) - Mc(l, m, k)|}{\sqrt{\sigma t(l, m, k)^2 + \sigma c(l, m, k)^2}} \quad (40)$$

where Mt(l, m, k) represents a mean value of the time series data ρ(l, m, k, i) of the brain function information of the task image; Mc(l, m, k), a mean value of the time series data ρ(l, m, k, i) of the brain function information of the rest image; σ$_t$(l, m, k), a standard deviation of the time series data ρ(l, m, k, i) of the brain function information of the task image; and σ$_c$(l, m, k), a standard deviation of the time series data ρ(l, m, k, i) of the brain function information of the rest image. Under this premise, if z=0, it can be said that there is no difference between the mean value of the time series data ρ(l, m, k, i) of the brain function information in the task image and the mean value of the time series data ρ(l, m, k, i) of the brain function information in the rest image. If Z=1, it means that the difference between the mean value of time series data ρ(l, m, k, i) of the brain function information in the task image and the mean value of time series data ρ(l, m, k, i) of the brain function information in the rest image is larger by a variation of the time series data. From such a tendency, it is thinkable that a voxel with large value of z score is an active region associated with the task.

For that reason, Equation (40) is changed as shown in $$z(l, m, k) = b(l, m, k)\frac{|Mt(l, m, k) - Mc(l, m, k)|}{\sqrt{\sigma t(l, m, k)^2 + \sigma c(l, m, k)^2}}, \quad (41)$$

and b(l, m, k) is corrected at Step S330 to $$b'(l,m,k)=\{1+\beta T_f(l,m,k)\}b(l,m,k) \quad (42)$$

where β is a weighting coefficient, using the connection degree vector $\vec{T}(l,m,k)$ of Equation (38) calculated at Step S320.

Next, at Step S340, the image generation means 7 generates a value based on the brain function data ρ(l, m, k) on the voxel determined to be significant as the image data based on the common significance level in all the voxels. Subsequently, at Step S350, the image display means 8 stereoscopically displays the image data generated at Step S340.

As described above, in the fourth embodiment, the value of the reference value (test value or significance level) upon testing the time series data of the brain function information which is acquired also from the MRI device has been adjusted for every voxel based on the diffusion tensor data acquired from the MRI device, so that activated brain regions can be located also in consideration of the connection structure between the activated brain regions.

Modified Example of Fourth Embodiment

In the fourth embodiment, when various data tests (for example, T-test, F-test, or Z-test) are performed on the time series data ρ(l, m, k, i) of the brain function information for every voxel, the reference value (test value, significance level, or the like) of the data test is adjusted using the connection degree vector $\vec{T}(l,m,k)$ calculated from the diffusion tensor data D(l, m, k) which is acquired by the diffusion tensor data acquisition means 2, but there is also considered a situation in achieving the object of the present invention such that when the data analysis is performed on the time series data ρ(l, m, k, i) of the brain function information for every voxel by various kinds of analysis techniques, a data test (for example, T-test, an F-test, or Z-test) is performed on whether or not the analysis technique is statistically significant.

Accordingly, as the present modified embodiment, it is considered to adjust the reference value (test value, significance level, or the like) in that case using the connection degree vector $\vec{T}(l,m,k)$.

Incidentally, only portions different from those of the fourth embodiment will be hereinafter described in order to avoid duplication.

Figure 22:
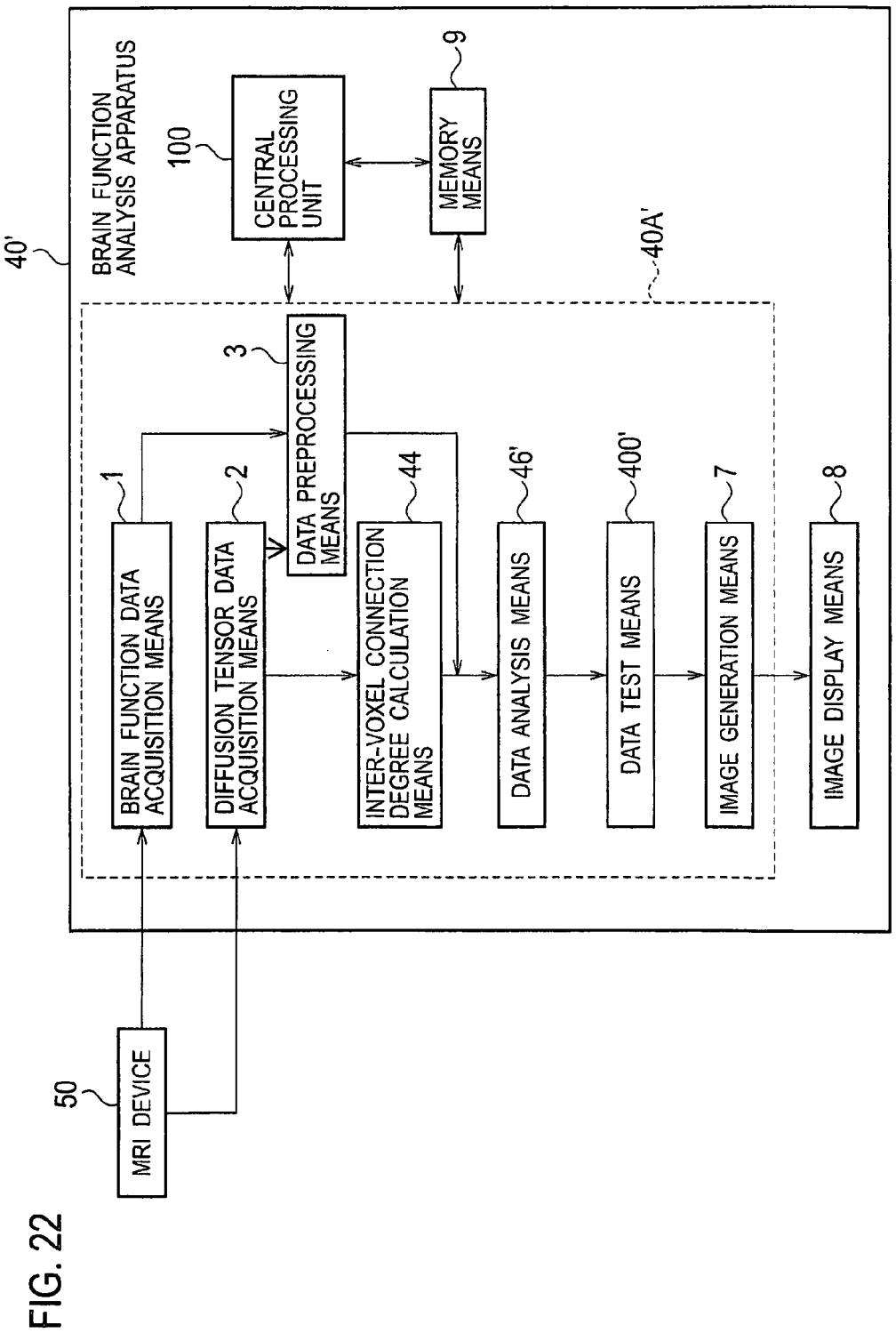
FIG. 22 is a block diagram showing a schematic configuration of a brain function analysis apparatus in accordance with a modified example of the fourth embodiment.

FIG. 22 is a conceptual diagram showing a schematic configuration of a brain function analysis apparatus in accordance with the modified example of the fourth embodiment. A configuration of a brain function analysis apparatus 40' in accordance with the present modified embodiment has a configuration in which data test means 400' and data analysis means 46' are added thereto instead of the data test means 400 in the configuration of the fourth embodiment.

The data analysis means 46' performs data analysis on the time series data ρ(l, m, k, i) of the brain function information which is acquired by the brain function data acquisition means 1 and is also pre-processed by the data preprocessing means 3 for every voxel using the analysis techniques, such as conventional classification, regression, and correlation.

The data test means 400' adjusts the reference value (test value, significance level, or the like) upon testing whether or not the analysis technique performed by the data analysis means 46' is statistically significant based on various data test (for example, T-test, F-test, or Z-test) using the connection degree vector $\vec{T}(l,m,k)$.

Figure 23:
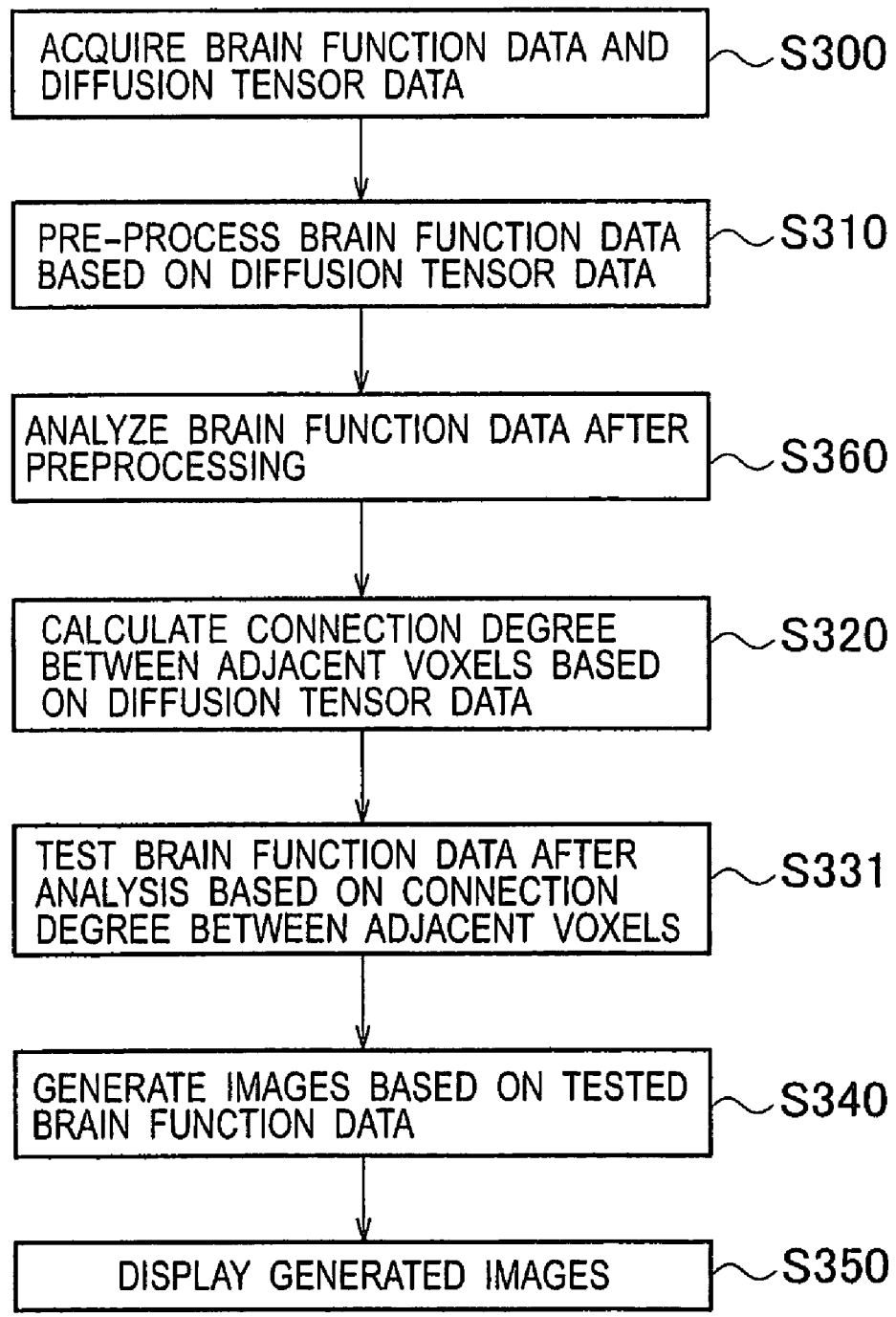
FIG. 23 is a flow chart showing one example of a data analysis procedure performed by the brain function analysis apparatus shown in FIG. 22.

FIG. 23 is a flow chart showing one example of a data analysis procedure performed by the brain function analysis apparatus shown in FIG. 22.

At Step S360, the data analysis means 46' performs data analysis on the time series data ρ(l, m, k, i) of the brain function information which is acquired by the brain function data acquisition means 1 and is also pre-processed by the data preprocessing means 3 for every voxel using the analysis techniques, such as conventional classification, regression, and correlation.

1. Classificational analysis techniques (discriminant analysis, decision tree, support vector machine, or the like)

1-1: In a case of the discriminant analysis, data classification is performed using various kinds of discrimination functions, while using the explaining variable as the time series data ρ(l, m, k, i) of the brain function information, and the external criterion as the time series data of the task and the rest.

1-2: In a case of the decision tree, data classification is performed using the decision tree, while using the explaining variable (attribute) as the time series data of the task and the rest and forming several classes by discretizing the time series data ρ(l, m, k, i) of the brain function information as the external criterion.

2. Regressive analysis technique (regression analysis using various kinds of functions (linear, non-linear))

2-1: In a case of the linear regression analysis, data analysis is performed using a linear regression equation while using the explaining variable as the task and the rest, and the explained variable as the time series data ρ(l, m, k, i) of the brain function information.

3. Correlative analysis technique (technique of taking correlation between an estimated model (function) and actual data)

Data analysis is performed by taking correlation between a model set in advance (for example, function such that stimulation is an input and the time series data of the brain function information is an output) and the actual time series data ρ(l, m, k, i) of the brain function information.

Subsequently, at Step S331 through Step S320 (similar to that of the fourth embodiment), the data test means 400' tests whether or not the result obtained at Step S360 is statistically significant. At this time, the reference value (test value, significance level, or the like) of the test is adjusted using the connection degree vector $\vec{T}(l,m,k)$ (Equation (38)).

For example, when the f-test is performed on the result obtained by the classificational analysis technique, the f-test is performed for every voxel on the result obtained at Step S360 to thereby calculate an f value. Subsequently, at the same step, using a voxel with high calculated f value (for example, voxel (l, m, k)) as a reference point, a value a(l+1, m, k) of a significance level in a voxel (for example, voxel (l+1, m, k)) of a periphery (26 directions) of the reference point is adjusted using, for example Equation (39) depending on to the connection degree vector $\vec{T}(l,m,k)$ calculated at Step S320.

In the case of the regressive analysis technique, the value of the threshold (corresponding to the significance level) may be adjusted as described above, while, in the case of the correlative analysis technique, the threshold of the correlation may be adjusted as described above.

Next, at Step S340, the image generation means 7 generates a value based on the brain function data ρ(l, m, k) on the voxel determined to be significant as the image data based on the significance level corrected at Step S330.

Subsequently, at Step S350, the image display means 8 stereoscopically displays the image data generated at Step S340.

Thus, effects similar to those of the third embodiment are obtained also in the present modified embodiment.

The above described embodiments are only exemplification, and the present invention is not limited to these.

For example, in each embodiment, the step of calculating the connection degree between the adjacent voxels may be performed just after the step of acquiring the brain function data and the diffusion tensor data.

Additionally, also as for the data analysis technique, it is possible to apply a wavelet analysis, a logistic regression analysis, or the like thereto.

Moreover, it is also possible to incorporate the second or the third embodiment into the first embodiment. First, when the second embodiment is incorporated into the first embodiment, it is only necessary to employ a configuration in which the brain function analysis apparatus 10 shown in FIG. 1 is further provided with data smoothing means which has the same function as that of the data smoothing means 200 or 200' shown in FIG. 10 or FIG. 13. Subsequently, what is necessary is that, after the data analysis means 6 determines a regression coefficient to minimize the data evaluation value Q at Step S50 of the first embodiment, the above data smoothing means is applied to the value of the regression coefficient to thereby smooth the value of the regression coefficient anisotropically. As a result of this, it is possible to generate images in which a degree of activity of the white matter (nerve fiber) is more emphasized as compared with the images obtained by the first embodiment.

Meanwhile, when the third embodiment is incorporated into the first embodiment, it is only necessary to employ a configuration in which the brain function analysis apparatus 10 shown in FIG. 1 is further provided with clustering means which has the same function as that of the clustering means 300 or 300' shown in FIG. 15 or FIG. 19. Subsequently, what is necessary is that, after the data analysis means 6 determines a regression coefficient to minimize the data evaluation value Q at Step S50 of the first embodiment, the above clustering means is applied to the value of the regression coefficient to thereby cluster the voxels. As a result of this, it is possible to generate images in which a degree of activity of the white matter (nerve fiber) is more emphasized as compared with the images obtained by the first embodiment.

Furthermore, it is also possible to extend the activated regions of the white matter voxel with respect to the results obtained by each of above embodiments by further using the diffusion tensor data D(l, m, k). The technique is basically similar to that of the tractography.

Further, it is also possible to catch the activation of the white matter by applying the above-described techniques (regression analysis, correlation, classification, independent component analysis, test, or the like) only to the white matter voxels.

Meanwhile, although the block design has been assumed as the experiment in each embodiment, the present invention is applicable to an event-related fMRI.

In addition, the present invention is applicable to a Connectivity Analysis. There are several techniques in the Connectivity Analysis, and in the case of, for example, SEM (Structural Equation Modeling) (or covariance structure analysis), correlation and test are performed on the way of computation, but the present invention is applicable in that case, and smoothing and clustering are also applicable thereto.

The information on a connection between neurons and nerve fibers has been acquired from the diffusion tensor data in the above, but if there is information (knowledge) on the connection which has been anatomically known already, it is also possible to use it.

Various embodiments other than those described above are possible without departing from the subject matter of the present invention, and the present invention is specified only by claims.

Figure 24:
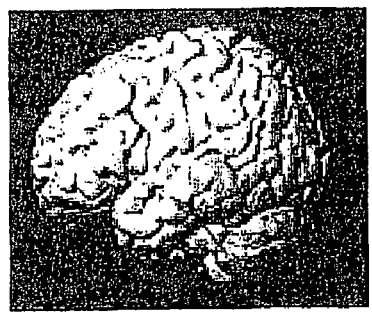
FIG. 24 is a view showing results of various kinds of brain function analyses performed when the subject is made to perform simple repetition using acoustic stimulations, wherein FIGS. 24A and 24B both show results of a T-test using SPM (FIG. 24A shows a case where a threshold of the T-test is corrected, whereas FIG. 24B is a case where the threshold of the T-test is not corrected)
Figure 24:
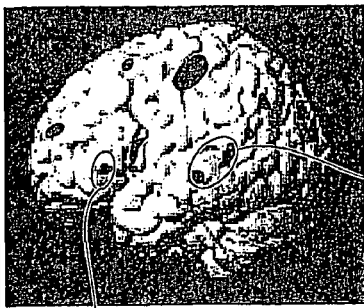
Figure 24:
Figure 24:

Finally, effects of the brain function analysis using the brain function analysis method of the present invention will be shown. FIG. 24 is a view showing results of various kinds of brain function analyses when the subject is made to perform simple repetition using acoustic stimulations. In the experiment, to repeat a voice coming from headphones as it is heard is defined as the task, and a situation where the subject thinks nothing as less as possible is defined as the rest. A volume number (measurement frequency) of the task is set to 48, a volume number (measurement frequency) of the rest is set to 60, and a volume number (measurement frequency) which is not used for the analysis is set to 12 (refer to FIG. 2). Additionally, TR (Time of Repetition: corresponding to a volume width in FIG. 2) is set to 5000 milliseconds. While the number of subjects is eight, analysis results of the subjects from whom excellent results are obtained in both of SPM and the brain function analysis method of the present invention will be shown hereinafter.

FIGS. 24A and 24B both show results of the T-test using SPM, wherein FIG. 24A shows analysis results when the correction is performed on the threshold of the T-test, and FIG. 24B shows analysis results when the correction is not performed on the threshold of the T-test. FIG. 24C shows analysis results according to the analysis technique combining SPM and the tractography, while FIG. 24D shows analysis results using the brain function analysis method in accordance with the first embodiment of the present invention. Note that, position compensation, normalization, and smoothing are performed as the preprocessing of SPM. A half-value width of the smoothing is set to 9 millimeters. Additionally, dTV is used for the tractography as software for diffusion tensor analysis.

As a premise, there are anatomically known that a Wernicke area (sensory speech area) and a Broca's area (motor speech area) are activated during the simple repetition, and both areas are connected by a bundle of nerve fibers called arcuate fasciculus. This arcuate fasciculus is used during utterance.

Even when SPM is used, the activation of the Wernicke area and the Broca's area cannot be detected when the threshold of the T-test is corrected as shown in FIG. 24A. Meanwhile, when SPM is used and the threshold of the T-test is not corrected, the activation of both areas is detected, but the arcuate fasciculus which connects both areas cannot be detected as shown in FIG. 24B. In contrast to these results, if the analysis technique combining SPM and the tractography is used, not only the activation of the Wernicke area and the Broca's area but also the arcuate fasciculus itself is detected as shown in FIG. 24C.

Meanwhile, when the brain function analysis method in accordance with the first embodiment of the present invention is used, it is possible to detect even activation of the arcuate fasciculus (pulse transmission in the nerve fiber constituting the arcuate fasciculus) in addition to the detection of the activation of both areas and the arcuate fasciculus which connects both areas as shown in the FIG. 24D.

Moreover, in the analysis technique combining SPM and the tractography, an analyst has to specify a trace start point and a trace end point of the nerve fiber in advance in detecting the nerve fiber (arcuate fasciculus in this case). Hence, this technique will not be effective in such a case that the trace start point and the trace end point of the nerve fiber cannot be specified in advance (for example, in such a task that an active region of the gray matter is not determined in advance). In contrast to that, according to the brain function analysis method in accordance with the first embodiment of the present invention, it is possible to detect the activation of the nerve fiber as shown in the FIG. 24D even when the trace start point and the trace end point of the nerve fiber cannot be specified in advance.

INDUSTRIAL APPLICABILITY

As described above, according to the present invention, as well as being able to specify the activated brain region, it is also possible to specify the nerve fiber (connection structure between active regions) even when the analyst does not specify the start point and an the point of the nerve fiber in advance, and it is further possible to detect the activation of the nerve fiber (pulse transmission in the nerve fiber), thus allowing the extremely effective brain function analysis method and brain function analysis program to be provided for medical diagnoses and treatments of higher brain dysfunction such as dementia, aphasia, schizophrenia, or the like.

The invention claimed is:
1. A brain function data analysis method, comprising:
computing, for each voxel, a connection degree vector indicating a degree of connectivity with its adjacent voxels based on diffusion tensor data capable of specifying a degree of diffusion of protons within the brain acquired on a voxel-by-voxel basis; and
analyzing brain function data capable of specifying activated brain regions acquired on the voxel-by-voxel basis, based on the connection degree vector.
2. The brain function data analysis method according to claim 1, wherein analyzing brain function data comprises calculating either of a minimum value and a maximum value of an evaluation value in which an evaluation value of the connection degree vector between the adjacent voxels is incorporated into an evaluation value for every voxel of the brain function data by a regression analysis.
3. The brain function data analysis method according to claim 1, wherein analyzing brain function data comprises adjusting a reference value of a test of the brain function data based on the connection degree vector.
4. The brain function data analysis method according to claim 1, wherein analyzing brain function data comprises adjusting a reference value of a classification of the brain function data based on the connection degree vector.
5. The brain function data analysis method according to claim 1, wherein analyzing brain function data comprises adjusting the brain function data based on predetermined anatomical data and the connection degree vector.
6. The brain function data analysis method according to claim 1, wherein analyzing brain function data comprises smoothing the brain function data based on the connection degree vector.

7. The brain function data analysis method according to claim 1, wherein analyzing brain function data comprises clustering the brain function data based on the connection degree vector.

8. The brain function data analysis method according to claim 1, further comprising pre-processing to transmit a value of the brain function data of an activated region voxel of specified activated brain regions which is located from the brain function data, to a value of the brain function data of another voxel based on the diffusion tensor data.

9. An article of manufacture including a computer-readable medium having instructions stored thereon that, if executed by a computing device, cause the computing device to perform operations comprising:
acquiring, on a voxel-by-voxel basis, brain function data capable of locating activated brain regions;
acquiring, on a voxel-by-voxel basis, diffusion tensor data capable of specifying a degree of diffusion of protons within the brain;
computing, for each voxel, a connection degree vector indicating a degree of connectivity with its adjacent voxels based on the diffusion tensor data; and
analyzing the brain function data based on the connection degree vector.

10. The article of manufacture of claim 9, wherein analyzing brain function data comprises calculating either of a minimum value and a maximum value of an evaluation value in which an evaluation value of the connection degree vector between the adjacent voxels is incorporated into an evaluation value for every voxel of the brain function data.

11. The article of manufacture of claim 9, wherein analyzing brain function data comprises testing the brain function data, and a reference value of the test is adjusted based on the connection degree vector.

12. The article of manufacture of claim 9, wherein analyzing brain function data comprises classifying the brain function data, and a reference value of the classification is adjusted based on the connection degree vector.

13. The article of manufacture of claim 9, wherein analyzing brain function data comprises adjusting the brain function data based on predetermined anatomical data model and the connection degree vector.

14. The article of manufacture of claim 9, wherein analyzing brain function data comprises smoothing the brain function data based on the connection degree vector.

15. The article of manufacture of claim 9, wherein analyzing brain function data comprises clustering the brain function data based on the connection degree vector.

16. The article of manufacture of claim 9, further comprising pre-processing to transmit a value of the brain function data of an activated region voxel which is located from the brain function data to a value of the brain function data of another voxel based on the diffusion tensor data.

17. A brain function analysis apparatus comprising:
brain function data acquisition means for acquiring, on a voxel-by-voxel basis, brain function data capable of locating activated brain regions;
diffusion tensor data acquisition means for acquiring, on a voxel-by-voxel basis, diffusion tensor data capable of specifying a degree of diffusion of protons within the brain;
data evaluation value constitution means for computing, for each voxel, a connection degree vector indicating a degree of connectivity with its adjacent voxels based on the diffusion tensor data; and
data analysis means for analyzing the brain function data based on the connection degree vector.

18. The brain function analysis apparatus according to claim 17, wherein the data analysis means calculates either of a minimum value and a maximum value of an evaluation value in which the evaluation value of the connection degree vector between the adjacent voxels is incorporated into an evaluation value for every voxel of the brain function data.

19. The brain function analysis apparatus according to claim 17, wherein the data analysis means is means for testing the brain function data, and a reference value of the test is adjusted based on the connection degree vector.

20. The brain function analysis apparatus according to claim 17, wherein the data analysis means is means for classifying the brain function data, and a reference value of the classification is adjusted based on the connection degree vector.

21. The brain function analysis apparatus according to claim 17, wherein the data analysis means adjusts the brain function data based on predetermined anatomical data and the connection degree vector.

22. The brain function analysis apparatus according to claim 17, further comprising data smoothing means for smoothing the brain function data based on the connection degree vector.

23. The brain function analysis apparatus according to claim 17, further comprising data clustering means for clustering the brain function data based on the connection degree vector.

24. The brain function analysis apparatus according to claim 17, further comprising data preprocessing means for pre-processing to transmit a value of the brain function data of an activated region voxel which is located from the brain function data acquired by the brain function data acquisition means to a value of the brain function data of another voxel based on the diffusion tensor data acquired by the diffusion tensor data acquisition means.

* * * * *

UNITED STATES PATENT AND TRADEMARK OFFICE
CERTIFICATE OF CORRECTION

PATENT NO. : 8,059,879 B2
APPLICATION NO. : 12/089855
DATED : November 15, 2011
INVENTOR(S) : Tsukimoto It is certified that error appears in the above-identified patent and that said Letters Patent is hereby corrected as shown below:

In Column 2, Line 65, delete "2004" and insert -- 2004. --, therefor.

In Column 2, Line 67, delete "1997" and insert -- 1997. --, therefor.

In Column 3, Lines 2-3, delete "Acadmic, 1988" and insert -- Academic, 1988. --, therefor.

In Column 3, Line 5, delete "2002" and insert -- 2002. --, therefor.

In Column 3, Line 9, delete "2003" and insert -- 2003. --, therefor.

In Column 21, Line 32, delete "in," and insert -- m --, therefor.

In Column 23, Line 6, delete "k)) along" and insert -- k) along --, therefor.

In Column 24, Line 12, delete "in," and insert -- m --, therefor.

In Column 26, Line 42, delete "in," and insert -- m --, therefor.

In Column 31, Line 19, delete "like)" and insert -- like). --, therefor.

In Column 31, Line 33, delete "non-linear))" and insert -- non-linear)). --, therefor.

In Column 31, Line 41, delete "data)" and insert -- data). --, therefor.

Signed and Sealed this
First Day of May, 2012

David J. Kappos
*Director of the United States Patent and Trademark Office*